(12) United States Patent
Minegishi et al.

(10) Patent No.: US 10,406,516 B2
(45) Date of Patent: Sep. 10, 2019

(54) ELECTRODE FOR WATER-SPLITTING REACTION AND METHOD FOR PRODUCING THE SAME

(71) Applicant: The University of Tokyo, Bunkyo-ku (JP)

(72) Inventors: Tsutomu Minegishi, Tokyo (JP); Kazunari Domen, Tokyo (JP); Jun Kubota, Tokyo (JP)

(73) Assignee: THE UNIVERSITY OF TOKYO, Bunkyo-ku (JP)

( * ) Notice: Subject to any disclaimer, the term of this patent is extended or adjusted under 35 U.S.C. 154(b) by 523 days.

(21) Appl. No.: 14/479,910

(22) Filed: Sep. 8, 2014

(65) Prior Publication Data
US 2014/0374270 A1 Dec. 25, 2014

Related U.S. Application Data

(63) Continuation of application No. PCT/JP2013/056182, filed on Mar. 6, 2013.

(30) Foreign Application Priority Data

Mar. 8, 2012 (JP) .................................. 2012-052248

(51) Int. Cl.
*C01B 3/04* (2006.01)
*C25B 1/00* (2006.01)
(Continued)

(52) U.S. Cl.
CPC ............ *B01J 35/004* (2013.01); *B32B 38/10* (2013.01); *C01B 3/042* (2013.01);
(Continued)

(58) Field of Classification Search
CPC ..... B01J 35/004; B01J 21/063; B01J 37/0244; B01J 35/002; B01J 23/10; B01J 27/24;
(Continued)

(56) References Cited

U.S. PATENT DOCUMENTS 6,121,191 A  9/2000 Komatsu et al.
6,265,341 B1 7/2001 Komatsu et al.
(Continued)

FOREIGN PATENT DOCUMENTS

CN   101143712 A   3/2008
CN   101620935 A   1/2010
(Continued)

OTHER PUBLICATIONS

JP 2007-107043 machine translation of description.*
(Continued)

*Primary Examiner* — Nicholas A Smith
*Assistant Examiner* — Colleen M Raphael
(74) *Attorney, Agent, or Firm* — Oblon, McClelland, Maier & Neustadt, L.L.P.

(57) ABSTRACT

The present invention provides an electrode for water-splitting reaction that is capable of increasing conductive path between a photocatalyst layer and a current collecting layer without inhibiting light absorption by photocatalyst, which comprises: a photocatalyst layer 10; a current collecting layer 30; and a contact layer 20 that contains semiconductor or good conductor and is provided between the photocatalyst layer 10 and the current collecting layer 30, wherein the contact layer 20 is provided along the surface shape of the photocatalyst layer 10 at the current collecting layer 30 side of the photocatalyst layer 10.

14 Claims, 10 Drawing Sheets

(51) Int. Cl.

| | | |
|---|---|---|
| *C25B 1/04* | (2006.01) | |
| *B01J 21/06* | (2006.01) | |
| *B01J 23/10* | (2006.01) | |
| *B01J 27/24* | (2006.01) | |
| *B01J 35/00* | (2006.01) | |
| *B01J 37/02* | (2006.01) | |
| *B32B 38/10* | (2006.01) | |
| *C23C 14/00* | (2006.01) | |
| *C23C 14/34* | (2006.01) | |

(52) U.S. Cl.
CPC .......... *C23C 14/0005* (2013.01); *C23C 14/34* (2013.01); *C25B 1/003* (2013.01); *C25B 1/04* (2013.01); *B01J 21/063* (2013.01); *B01J 23/10* (2013.01); *B01J 27/24* (2013.01); *B01J 35/002* (2013.01); *B01J 37/0244* (2013.01); *B32B 2307/202* (2013.01); *B32B 2457/00* (2013.01); *Y02E 60/364* (2013.01); *Y02E 60/366* (2013.01)

(58) Field of Classification Search
CPC ....... C25B 1/04; C25B 1/003; C23C 14/0005; C23C 14/34; B32B 38/10; B32B 2307/202; B32B 2457/00; C01B 3/042; Y02E 60/366
USPC ........... 205/340; 156/247; 204/192.1, 290.01
See application file for complete search history.

(56) References Cited

U.S. PATENT DOCUMENTS

| 6,365,545 | B1 | 4/2002 | Komatsu et al. | |
|---|---|---|---|---|
| 10,030,311 | B2* | 7/2018 | Sato .................. | C25B 1/003 |
| 2005/0194041 | A1* | 9/2005 | Fan .................... | C25B 1/003 |
| | | | | 136/252 |
| 2006/0105911 | A1 | 5/2006 | Nakamura et al. | |
| 2006/0219294 | A1* | 10/2006 | Yabuuchi ............ | H01G 9/2031 |
| | | | | 136/263 |
| 2007/0184309 | A1* | 8/2007 | Gust, Jr. ............. | C12P 3/00 |
| | | | | 429/2 |
| 2009/0014056 | A1* | 1/2009 | Hockaday .......... | H01L 31/03528 |
| | | | | 136/247 |
| 2010/0282601 | A1* | 11/2010 | Nomura ............. | C25B 1/003 |
| | | | | 204/242 |
| 2012/0010068 | A1* | 1/2012 | Zhao .................. | B01J 21/063 |
| | | | | 502/1 |
| 2012/0048337 | A1* | 3/2012 | Fukui ................. | H01G 9/2031 |
| | | | | 136/244 |
| 2013/0081940 | A1* | 4/2013 | Menon ............... | C25B 1/003 |
| | | | | 204/242 |

FOREIGN PATENT DOCUMENTS

| GB | 2 416 778 A | 2/2006 |
|---|---|---|
| JP | 11-47611 A | 2/1999 |
| JP | 2005-261988 A | 9/2005 |
| JP | 2006-297230 A | 11/2006 |
| JP | 2007-27572 A | 2/2007 |
| JP | 2007-70675 A | 3/2007 |
| JP | 2007-107043 A | 4/2007 |
| JP | 2007-181820 A | 7/2007 |
| JP | 2007-252974 A | 10/2007 |
| JP | 2008-104899 A | 5/2008 |
| JP | 2011-119417 A | 6/2011 |
| JP | 2011-131170 A | 7/2011 |
| JP | 2012-46385 A | 3/2012 |

OTHER PUBLICATIONS

International Search Report dated Jun. 17, 2013 in PCT/JP2013/056182 with English Translation.
Akihiko Kudo et al., "Heterogeneous Photocatalyst Materials for Water Splitting", Chemical Society Reviews, 2009, pp. 253-278 and Cover Page.
Naoyuki Nishimura et al., "Effect of $TiCl_4$ Treatment on the Photoelectrochemical Properties of $LaTiO_2N$ Electrodes for Water Splitting Under Visible Light", Thin Solid Films, 518, 2010, pp. 5855-5859.
Yasumichi Matsumoto et al., "Electrochemistry of Titanate(IV) Layered Oxides", J. Phys. Chem. B 2001, 105, pp. 10893-10899.
Combined Chinese Office Action and Search Report dated Aug. 18, 2015 in Chinese Patent Application No. 201380013254.0 (with partial English Translation and English translational of category of cited documents).
Office Action dated Jul. 19, 2016 in Japanese Patent Application No. 2014-503520 (with unedited computer generated English language translation).
Examination Report dated May 4, 2016 in GCC Patent Application No. GC 2013-23782.
Examination Report dated Nov. 20, 2016 in GCC Patent Application No. GC 2013-23782.
Office Action dated Mar. 22, 2018 in GCC Patent Application No. GC 2013-33812, filed Mar. 6, 2013.
Office Action dated Mar. 15, 2016 in Japanese Patent Application No. 2012-103243 (with unedited computer generated English language translation).
Sakamoto Naoyuki, et al., "Effect of Nanoparticle Support to Various Photocatalysts" Catalyst Debate Lecture Proceedings, vol. 101, 2008, p. 3 (with Cover Page).
Office Action dated Jul. 2, 2018 in GCC Patent Application No. GC 2013-33812, 3 pages.
Office Action dated Jun. 5, 2018 in Indian Patent Application No. 7512/DELNP/2014 (with English translation).

* cited by examiner

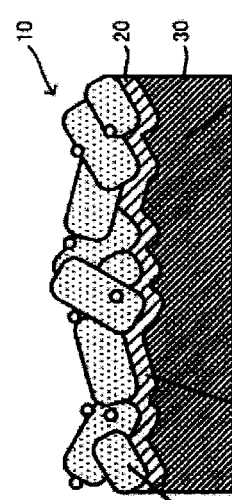
FIG. 11A
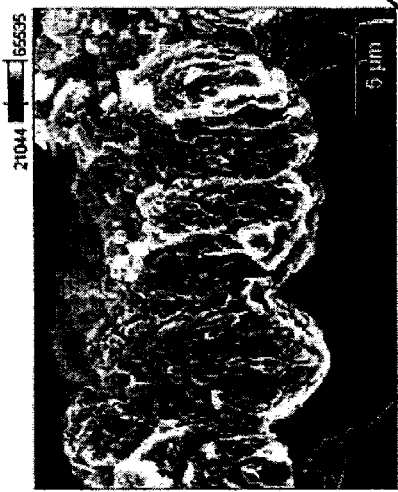
FIG. 11B
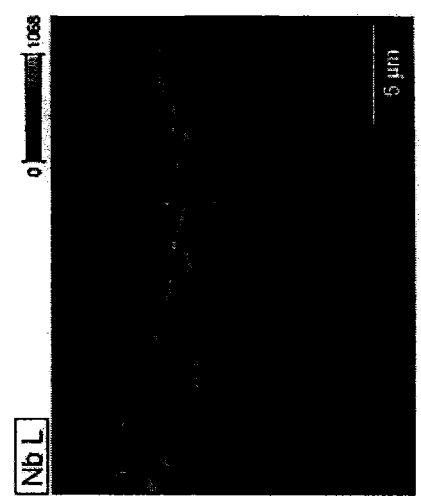
FIG. 11C
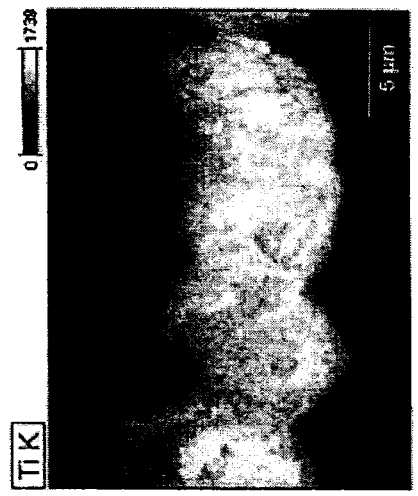
FIG. 11D

ELECTRODE FOR WATER-SPLITTING REACTION AND METHOD FOR PRODUCING THE SAME

TECHNICAL FIELD

The present invention relates to an electrode for water-splitting reaction comprising a photocatalyst, which is capable of producing hydrogen and/or oxygen by conducting a water-splitting reaction utilizing sunlight.

BACKGROUND ART

Practical realization of high performance light energy conversion system utilizing renewable energy such as solar energy rapidly increases the importance in recent years from the standpoints of inhibition of global warming and the aim of departure from dependency of fossil resources that are running out. Above all, the technology of splitting water using solar energy to produce hydrogen is not only a technology of the existing petroleum refining and raw material supply of ammonia and methanol, but a technology required in the upcoming hydrogen energy society based on a fuel cell.

Water-splitting reaction by photocatalyst is widely studied from the 1970s (Non-Patent Document 1). Many photocatalysts had the disadvantages that due to large band gap, water splitting proceeds if in ultraviolet region, but visible light region cannot be utilized, and even through the visible light region can be utilized, the catalyst itself is unstable in water. However, on or after 2000, water can be split by light energy in a visible light region, and photocatalyst stable in water, that is, visible light photocatalyst, began to get published For example, oxynitride, nitride, oxysulfide and sulfide are known as the visible light photocatalyst (Non-Patent Document 1).

Water splitting method by photocatalyst is greatly classified into two kinds. One is a method of conducting water splitting reaction in a suspension, and another is a method of conducting water splitting using an electrode comprising a conductive metal substrate and photocatalyst deposited on the substrate in a thin film form, and a counter electrode.

The former is that photocatalyst capable of performing complete splitting of water is currently limited, and additionally, hydrogen and oxygen that are products of water splitting reaction are formed as a mixed gas, and this requires separation of hydrogen and oxygen after recovering. On the other hand, the latter has the advantage of having many selections of photocatalysts that can be used. For this reason, in recent years, an example of forming visible light water splitting photocatalyst in a thin film form and carrying out water splitting in high efficiency is reported (Non-Patent Document 2).

Generally, deposition of photocatalyst on a conductive metal support is conducted by physical vapor deposition (PVD) methods represented by a vacuum deposition method and a sputtering method and chemical vapor deposition (CVD) methods (those methods are generically named dry process); coating methods represented by spin coating and screen printing; sol-gel methods; and electrophoretic deposition (EPD) methods (Non-Patent Document 3 and Patent Document 1).

On the other hand, a method of covering the circumference of photocatalyst particles with semiconductor or good conductor, having conductivity higher than that of photocatalyst used, in order to improve electron conductivity between photocatalyst particles and between photocatalyst and a support is proposed. For example, a method of covering the circumference of iron oxide or tungsten oxide particles that are photocatalyst with oxide semiconductor of titanium, aluminum, antimony, tin, zinc, zirconium or the like to improve conductivity is proposed (Patent Document 2).

However, where oxides of metal species different from photocatalyst, such as titanium oxide are used as a conductor to iron oxide or tungsten oxide that is photocatalyst, the respective energy levels greatly differ. This gave rise to the problem that mismatch occurs in level, causing resistance, and conductivity is decreased.

To solve the above problem, in an electrode for water-splitting reaction comprising a support having deposited thereon at least one kind of photocatalyst particles selected from the group consisting of oxynitride, nitride, oxysulfide and sulfide, an electrode for water-splitting reaction having semiconductor or good conductor between the photocatalyst particles and between the photocatalyst particles and the support is disclosed (Patent Document 3). According to this disclosure, semiconductor or good conductor is present around the photocatalyst particles, and as a result, internal resistance of the electrode is decreased, and photoelectric conversion efficiency can be improved.

CITATION LIST

Patent Document

Patent Document 1: JP-A-2006-297230
Patent Document 2: GB200416616A
Patent Document 3: JP-A-2011-131170

Non-Patent Document

Non-Patent Document 1: Chem. Soc. Rev., 2009, 38, 253-278
Non-Patent Document 2: Thin Solid Films, 2010, 518, 5855-5859
Non-Patent Document 3: J. Phys. Chem. B 2001, 105, 10893-10899

SUMMARY OF THE INVENTION

Problems that the Invention is to Solve

Visible light photocatalyst has excellent performance in water splitting performance in that longer wavelength light can be utilized in water photolysis. On the other hand, the visible light photocatalyst is required to conduct nitridation reaction and sulfidation reaction in producing the photocatalyst. Those reactions require production processes at high temperature, and therefore have the problem that when the photocatalyst is deposited on a metal support, it is difficult to apply to a production method by the above-described dry process.

When photocatalyst particles suspended in a solution are deposited as a starting raw material on a metal support by a coating method, electrophoresis or the like, contact face between support surface and photocatalyst particles and between photocatalyst particles is small. This gave rise to the problem that resistance is generated and electron conductivity in a photocatalyst film and electron conductivity between photocatalyst and support surface are remarkably decreased.

On the other hand, in the technique according to Patent Document 3, charge transfer is further accelerated in order to further improve photoelectric conversion efficiency. As a result, more semiconductors and good conductors must be introduced in the circumference of photocatalyst particles to increase conductive path. However, where many conductors are introduced, there was the problem that the conductors absorb light or reflect light, thereby inhibiting light absorption by photocatalyst.

The technique according to Patent Document 3 is the embodiment that photocatalyst particles are fixed to a support and conductor is then introduced, and therefore had the problem that semiconductor or good conductor is difficult to be introduced between the photocatalyst particles and the support, and conduct path is difficult to be formed between the photocatalyst particles and the support.

The present invention has been made in view of the above problems, and has an object to provide an electrode for water-splitting reaction capable of increasing conductive path between a photocatalyst layer and a current collecting layer without inhibiting light absorption by photocatalyst, and a method for producing the same.

Means for Solving the Problems

As a result of intensive investigations to solve the above problems, the present inventors have obtained the following findings.

(1) In an electrode for water-splitting reaction, conductive path is secured between a photocatalyst layer and a current collecting layer by providing a contact layer containing semiconductor or good conductor between the photocatalyst layer and the current collecting layer.

(2) In an electrode for water-splitting reaction, when the photocatalyst layer consists essentially of photocatalyst particles and the contact layer is provided along a surface shape at a current collecting layer side of the photocatalyst layer, the photocatalyst particles in the photocatalyst layer and the contact layer are directly contacted to each other. As a result, conductive path between the photocatalyst layer and the current collecting layer is increased.

(3) In an electrode for water-splitting reaction, the form that light receivable photocatalyst particles come in contact with the contact layer is obtained by decreasing the thickness of the photocatalyst layer (for example, the form that one to three layers of the photocatalyst particles are laminated). As a result, photoelectric conversion efficiency is improved.

(4) In an electrode for water-splitting reaction, absorption or reflection of light by semiconductor or good conductor can be inhibited by containing semiconductor or good conductor in the photocatalyst layer and eccentrically locating the semiconductor or the good conductor in the photocatalyst layer at a contact layer side than an opposite side (light-receiving face side) to the contact layer (in other words, amount of semiconductor or good conductor present at the light-receiving face side is decreased) As a result, photoelectric conversion efficiency is improved.

(5) The electrode for water-splitting reaction can be easily produced by forming a photocatalyst layer, forming a contact layer on one face of the photocatalyst layer, and then forming a current collecting layer on a face at a side opposite the photocatalyst layer of the contact layer.

(6) Particularly, the electrode can be easily produced by providing a photocatalyst layer on a substrate, depositing semiconductor or good conductor on a face at a side opposite the substrate of the photocatalyst layer to form a contact layer along a face shape of the photocatalyst layer, providing a current collecting layer on a face at a side opposite the photocatalyst layer of the contact layer, and then removing the substrate.

(7) The contact layer and the current collecting layer can be easily formed by a sputtering method.

(8) An electrode for water-splitting reaction having high photoelectric conversion efficiency can be produced from a photocatalyst that has been difficult to exert the photoelectric conversion efficiency by a sputtering method or the like, by forming the photocatalyst layer with photocatalyst particles.

(9) By forming the photocatalyst layer with photocatalyst particles, production efficiency is improved by sputtering, vapor deposition or the like, and an electrode having large area can be produced.

The present invention has been made based on the following findings.

A first invention is an electrode for water-splitting reaction comprising: a photocatalyst layer; a current collecting layer; and a contact layer that contains semiconductor or good conductor and is provided between the photocatalyst layer and the current collecting layer, wherein the photocatalyst layer consists essentially of photocatalyst particles, and the photocatalyst layer is provided along the surface shape of the photocatalyst layer at the current collecting layer side of the photocatalyst layer.

The term "consists essentially of photocatalyst particles" used herein means that the photocatalyst layer consists of photocatalyst particles described hereinafter, further contains semiconductor or good conductor, or contains other components such as a metal oxide, a composite oxide, or a hydrophilic material that does not have absorption in a visible light region in a range that the advantage of the present invention is not impaired, and preferably means that the photocatalyst layer consists of the photocatalyst particles described hereinafter, or further contains semiconductor or good conductor.

In the first invention, it is preferably that the number of stack of photocatalyst particles the photocatalyst layer in a lamination direction of the photocatalyst layer and the contact layer is from 1 to 3. The term "the number of stack of photocatalyst particles in a lamination direction of the photocatalyst layer and the contact layer" means the number of photocatalyst particles stacked vertically toward a light receiving face from the contact layer, and can be specified by, for example, observing a cross-section of an electrode for water-splitting reaction with SEM-EDX, or by an optical microscope, a surface profiler or the like.

In the first invention, the photocatalyst layer may contain semiconductor or good conductor. In this case, it is preferred that the semiconductor or the good conductor is eccentrically located in the photocatalyst layer at the contact layer side than the side opposite the contact layer. The term "eccentrically located at the contact layer side than the side opposite the contact layer" means that semiconductor or good conductor is contained in relatively large amount at a contact layer side than a light receiving face side of the photocatalyst layer.

The electrode for water-splitting reaction according to the first invention is preferably that a photocurrent density at measurement potential of 1 V (vs. RHE) is 350 $\mu A/cm^2$ or more.

A second invention is a method for producing an electrode for water-splitting reaction, comprising: a photocatalyst layer formation step of forming a photocatalyst layer; a contact layer formation step of covering one face of the photocatalyst layer with semiconductor or good conductor to form a contact layer; and a current collecting layer formation step of forming a current collecting layer on a face of the contact layer at the side opposite the photocatalyst layer of the contact layer.

In the contact layer formation step according to the second invention, it is preferred that the contact layer is formed on one face of the photocatalyst layer by sputtering the semiconductor or the good conductor.

In the current collecting layer formation step according to the second invention, it is preferred that the current collecting layer is formed by sputtering.

In the second invention, it is more preferred that the method further comprises a non-contact photocatalyst removal step of removing the photocatalyst particles that are not come in contact with the contact layer.

In the photocatalyst layer formation step according to the second invention, it is preferred that the photocatalyst layer is formed by laminating photocatalyst on one face of a first substrate. In this case, it is preferred in the non-contact photocatalyst removal step that the first substrate is removed.

In the second invention, it is preferred that the method further comprises a reinforcing substrate formation step of providing a second substrate at a side opposite the contact layer of the current collecting layer after the current collecting layer formation step.

A third invention is a method for producing an electrode for water-splitting reaction, comprising a photocatalyst layer formation step of laminating photocatalyst particles on one face of a first substrate; a contact layer formation step of forming a contact layer by covering a face of the photocatalyst layer at the side opposite the first substrate side of the photocatalyst layer with semiconductor or good conductor; a current collecting layer formation step of forming a current collecting layer on a face of the contact layer at the side opposite the photocatalyst layer of the contact layer; a reinforcing substrate formation step of laminating a second substrate on a face of the current collecting layer at a side opposite the contact layer of the current collecting layer; and a substrate peeling step of peeling the first substrate.

In the third invention, it is preferred that the contact layer is formed by sputtering in the contact layer formation step.

A fourth invention is a method for producing hydrogen, comprising irradiating an electrode for water-splitting reaction dipped in water or an electrolyte aqueous solution with light to conduct a water photolysis, wherein the electrode for water-splitting reaction is the electrode for water-splitting reaction according to the first invention.

A fifth invention is a method for producing hydrogen, comprising irradiating an electrode for water-splitting reaction dipped in water or an electrolyte aqueous solution with light to conduct a water photolysis, wherein the electrode for water-splitting reaction is the electrode for water-splitting reaction obtained by the second invention or the third invention.

Advantage of the Invention

According to the present invention, the contact layer containing semiconductor or good conductor is provided between the photocatalyst layer and the current collecting layer, the photocatalyst layer consists essentially of photocatalyst particles, and the contact layer is provided along a surface shape at a current collecting layer side (side opposite a light receiving face) of the photocatalyst layer. This makes it possible to increase conductive path between the photocatalyst layer and the current collecting layer without inhibiting light absorption by photocatalyst, and can improve photoelectric conversion efficiency.

According to the present invention, of an electron and a hole generated in photocatalyst by light irradiation, the hole is guided in the contact layer when the photocatalyst is a photocatalyst for hydrogen production, and the electron is guided in the contact layer when the photocatalyst is a photocatalyst for oxygen production. As a result, recoupling is inhibited, and photoelectric conversion efficiency can be improved.

Furthermore, according to the present invention, even in case of using a photocatalyst that is required to be supported in a particle form, an electrode having high photoelectric conversion efficiency can be obtained. Since such photocatalyst, for example, is produced through a high temperature reaction such as nitridation reaction or sulfidation reaction, the photocatalyst is difficult to be formed in a thin film form, such as a visible light photocatalyst containing at least two kinds of metals.

Water splitting activity of photocatalyst greatly depends on crystallinity of photocatalyst, and activity tends to become high as the crystallinity is high. Visible light photocatalyst generally has high crystallinity, and a method of obtaining in the form of powdery particles is established as the production method. Therefore, utilizing the production technique of a visible light photocatalyst without any change, a photocatalyst electrode having high efficiency can be produced using powdery photocatalyst particles obtained.

Furthermore, according to the present invention, the photocatalyst layer is not required to be formed by sputtering or the like in which time required in the step is relatively long. As a result, production time can be shortened.

BRIEF DESCRIPTION OF THE DRAWINGS

FIG. 11A to FIG. 11D are photographs and element mapping view, by SEM-EDS in cross-sections of electrodes for water-splitting reaction according to Examples.

MODE FOR CARRYING OUT THE INVENTION

<Water Splitting Reaction Apparatus (Two Electrode System)>

Figure 1:
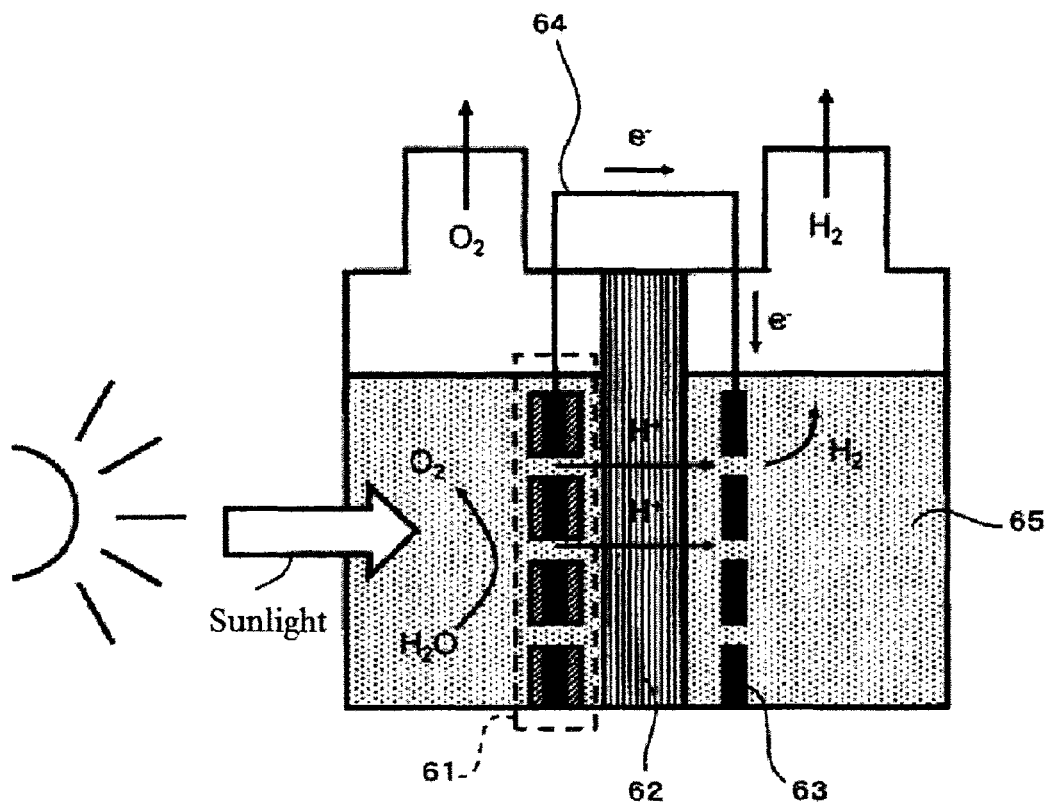
FIG. 1 is a conceptual view of a water splitting reaction apparatus (two electrode system) that is one application example of the electrode for water-splitting reaction according to the present invention.

Schematic view of a water splitting reaction apparatus (two electrode system) is shown in FIG. 1. In FIG. 1, an anode 61 (electrode at oxidation side) and a cathode 63 (electrode at reduction side) are connected by a conductor 64, and those are dipped in water or an electrolyte aqueous solution 65. The electrolyte solution in the anode 61 and the cathode 63 are separated by a diaphragm 62.

In FIG. 1, the electrode for water-splitting reaction of the present invention is used as the anode 61. However, the electrode for water-splitting reaction of the present invention may be used as the cathode 63, and the electrode for water-splitting reaction of the present invention may be used as the anode 61 and the cathode 63.

When the electrode 61 for water-splitting reaction of the present invention is used as a cathode, sunlight is inserted from a cathode side, and when the electrode for water-splitting reaction of the present invention is used as an anode and a cathode, sunlight is inserted from both sides of the anode and the cathode.

Generally, in a water splitting reaction apparatus that recovers hydrogen gas and oxygen gas separately, a two electrode system constituted of an electrode for water-splitting reaction and a counter electrode is used. In water splitting reaction in the two electrode system, the following reaction proceeds on each electrode in an acidic solution.

(Anode) $H_2O + 2h^+ \rightarrow \frac{1}{2}O_2 + 2H^+$ (Cathode) $2H^+ + 2e^- \rightarrow H_2$ wherein $h^+$ is a hole, and $e^-$ is an electron.

In a neutral solution, the following reaction proceeds on each electrode.

(Anode) $H_2O + 2h^+ \rightarrow \frac{1}{2}O_2 + 2H^+$ (Cathode) $2H_2O + 2e^- \rightarrow H_2 + 2OH^-$ In a basic solution the following reaction proceeds on each electrode.

(Anode) $2OH^- + 2h^+ \rightarrow \frac{1}{2}O_2 + H_2O$ (Cathode) $2H_2O + 2e^- \rightarrow H_2 + 2OH^-$ In this case, it is important how an electron ($e^-$) or a hole ($h^+$) on a catalyst surface light-excited and a reaction material participate efficiently, and how recoupling between an electron and a hole is inhibited and electrons generated guide in a cathode side efficiently. Particularly, resistance between photocatalyst particles and resistance between photocatalyst particles and a current collector inhibit electron conduction. Therefore, this must be reduced as possible.

The electrode for water-splitting reaction of the present invention that can increase conductive path between a photocatalyst layer and a current collecting layer without inhibiting light absorption by a photocatalyst, can decrease resistance between photocatalyst particles and resistance between photocatalyst particles and a current collector, and can improve photoelectric conversion efficiency is described below.

<Electrode for Water-Splitting Reaction>

Figure 2:
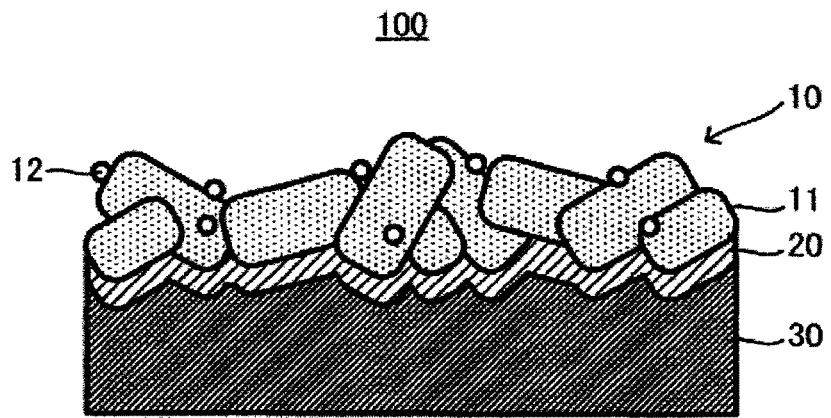
FIG. 2 is a view schematically showing an electrode (100) for water-splitting reaction of the present invention according to one embodiment.

The electrode 100 for water-splitting reaction of the present invention according to one embodiment is schematically shown in FIG. 2. The electrode 100 for water-splitting reaction comprises a photocatalyst layer 10, a current collecting layer 20, and a contact layer 20 containing semiconductor or good conductor provided between the photocatalyst layer 10 and the contact layer 30, wherein the photocatalyst layer 10 consists essentially of photocatalyst particles 11, and the contact layer 20 is provided along a shape at a current collecting layer 30 side of the photocatalyst layer 10. In the electrode 100 for water-splitting reaction, electrons generated by light irradiation in the photocatalyst layer 10 flow to the current collecting layer 30 through the contact layer 20.

(Photocatalyst Layer 10)

The photocatalyst layer 10 is a layer consisting essentially of the photocatalyst particles 11, and cocatalysts 12 are optionally supported on the photocatalyst particles 11.

The photocatalyst constituting the photocatalyst particle 11 can be any compound so long as the following requirements are satisfied.

(1) Potential of electrons generated by light irradiation is negative than potential that can reduce hydrogen ion or water molecule to hydrogen molecule, or potential of holes generated by light irradiation is positive than potential that can oxidize water or hydride ion into oxygen molecule.

(2) Even though the photocatalyst is irradiated with light in an aqueous solution and water splitting reaction proceeds, the compound is stable.

The shape of the photocatalyst particles 11 is preferably a powder shape. The term "powder shape" used herein means an aggregate of solids in which bonding between photocatalyst particles is mild, and having a certain degree of fluidity. The term "powder shape" preferably means a state that when the photocatalyst particles 11 have formed the photocatalyst layer 10, the photocatalyst particles 11 are bonded to each other by electrostatic force.

Examples of the photocatalyst at a hydrogen generation side, that reduces hydrogen ion or water specifically include:

oxides such as $SrTiO_3$, $SrTiO_3$ doped with Cr, Sb, Ta, Rh, Na, Ga, K, La or the like, $LaTi_2O_7$, $SnNb_2O_6$, $CuBi_2O_4$, $LaTi_2O_7$ doped with Cr, Fe or the like, and $SnNb_2O_6$;

oxynitride compounds such as $LaTiO_2N$, $CaTaO_2N$, $SrTaO_2N$, $BaTaO_2N$, $LaTaO_2N$, $Y_2Ta_2O_5N_2$, $Zn_{1+x}GeN_2O_x$ and $Ga_{1-x}Zn_xN_{1-x}O_x$ (x is a numerical value of from 0 to 1, hereinafter the same);

nitride compounds such as TaON, $Ta_3N_5$, GaN, $Ta_3N_5$, GaN doped with Mg, and $Ge_3N_4$;

sulfide compounds such as ZnS, ZnS doped with Cu, Ni or Pb, CdS doped with Ag, $Cd_xZn_{1-x}S$, $CuInS_2$, $CuIn_5S_8$, $CuGaS_2$, $CuGa_3S_5$, $CuGa_5S_8$, $AgGaS_2$, $AgGa_3S_5$, $AgGa_5S_8$, $AgGa_{0.9}In_{0.1}S_2$, $AgIn_5S_8$, $NaInS_2$, $AgInZn_7S_9$, $CuInGaS_2$, $Cu_{0.09}In_{0.09}Zn_{1.82}S_2$, $Cu_{0.25}Ag_{0.25}In_{0.5}ZnS_2$, and $Cu_2ZnSnS_4$;

oxysulfide compounds such as $Sm_2Ti_2O_5S_2$, $La_5Ti_2CuS_5O_7$, $La_5Ti_2AgS_5O_7$, and $La_5Ti_2AgO_5S_7$;

oxysulfide compounds containing La and In (described in Chemistry Letters 2007, 36, 854-855);

selenide compounds such as $CuGaSe_2$, $CuGa_3Se_5$, $CuGa_5Se_8$, $Ag_xCu_{1-x}GaSe_2$, $Ag_xCu_{1-x}Ga_3Se_5$, $Ag_xCu_{1-x}Ga_5Se_8$, $AgGaSe_2$, $AgGa_3Se_5$, $AgGa_5Se_8$, and $CuInGaSe_2$; and oxyselenide compounds such as $La_5Ti_2CuSe_5O_7$, $La_5Ti_2AgSe_5O_7$;

chalcogenide compounds in which S and Se are partially mixed in optional proportions, such as $La_5Ti_2Cu(S_x, Se_{1-x})_5O_7$, and $La_5Ti_2Ag(S_x,Se_{1-x})_5O_7$.

However, the photocatalyst is not limited to the exemplified materials.

Examples of the photocatalyst at an oxygen generation side, that oxidizes water molecule or hydroxide ion into oxygen molecule specifically include:

oxides such as $TiO_2$ doped with Cr, Ni, Sb, Nb, Th, Sb or the like, $WO_3$, $Bi_2WO_6$, $Bi_2MoO_6$, $In_2O_3(ZnO)_3$, $PbBi_2Nb_2O_9$, $BiVO_4$, $Ag_3VO_4$, $AgLi_{1/3}Ti_{2/3}O_2$, and $AgLi_{1/3}Sn_{2/3}O_2$;

oxynitride compounds such as $LaTiO_2N$, $CaNbO_2N$, $BaNbO_2N$, $SrNbO_2N$, $LaNbO_2N$, TaON, $CaTaO_2N$, $SrTaO_2N$, $BaTaO_2N$, $LaTaO_2N$, $Y_2Ta_2O_5N_2$, $Zn_{1+x}GeN_2O_x$, $Ga_{1-x}Zn_xN_{1-x}O_x$;

nitride compounds such as $Ta_3N_5$, $Ta_3N_5$ doped with Mg and Zr, GaN, GaN doped with Mg, and $Ge_3N_4$;

oxysulfide compounds such as $Sm_2Ti_2O_5S_2$, and $La_5Ti_2AgS_5O_7$;

oxyselenide compounds such as $La_5Ti_2AgSe_5O_7$; and chalcogenide compounds in which S and Se are partially mixed in optional proportions, such as $La_5Ti_2Cu(S_x, Se_{1-x})_5O_7$, and $La_5Ti_2Ag(S_x,Se_{1-x})_5O_7$.

However, the photocatalyst is not limited to the exemplified materials.

In the present invention, the photocatalyst is preferably at least one compound selected from the group consisting of oxynitride, nitride, oxysulfide, sulfide, selenide and oxyselenite, and more preferably at least one compound selected from the group consisting of oxynitride, nitride, oxysulfide and selenide. Above all, compounds containing at least two kinds of metals are preferred, and of those, visible light photocatalysts are more preferred.

Those photocatalysts are generally obtained by conducting nitridation reaction or sulfidation reaction under high temperature conditions. Therefore, it may be difficult to support those photocatalysts on a substrate by a method such as sputtering or the like. When those photocatalysts consist essentially of photocatalyst particles, the performance of those photocatalysts is exerted, and an electrode having high photoelectric conversion efficiency can be obtained.

Oxynitride and nitride are further preferred from the standpoint of high photoelectric conversion efficiency. Use of $LaTiO_2N$, $Ta_3N_5$ and $Ta_3N_5$ doped with Mg and Zr is preferred from that photocatalyst activity is high, abundance on the ground is rich, and costs are low, and $LaTiO_2N$ is most preferred.

The above-described photocatalysts can be synthesized by the conventional methods (for example, a method disclosed in J. Phys. Chem. B 2003, 107, 791-797, a method disclosed in Journal of Flux Growth, 2010, 5, 81, and a method disclosed in Catalysis Today 2003, 78, 555-560).

The average particle size of primary particles of the photocatalysts 11 is not particularly limited so long as its performance is exerted. The lower limit is preferably 1 nm or more, more preferably 10 nm or more, and still more preferably 50 nm or more. The upper limit is preferably 500 µm or less, more preferably 300 µm or less, still more preferably 200 µm or less, particularly 100 µm or less.

The average particle size of secondary particles of the photocatalysts 11 can be a size that can achieve sufficient light absorption while contacting the contact layer 20. The lower limit is 10 nm or more, preferably 20 nm or more, more preferably 50 nm or more, still more preferably 100 nm or more, and particularly preferably 500 nm or more. The upper limit is 5000 µm or less, preferably 1000 µm or less, more preferably 500 µm or less, still more preferably 300 µm or less, particularly preferably 200 µm or less, and most preferably 100 µm or less.

The term "primary particles" used herein means particles of minimum unit constituting a powder, and the term "secondary particles" used herein means particles in the state that the primary particles are aggregated. The term "particle size" used herein means tangent diameter in a constant direction (Feret's diameter), and the particle size of the primary particles and the secondary particles can be measured by the conventional means such as XRD, TEM or SEM.

If necessary, the cocatalysts 12 are supported on the photocatalyst particles 11.

Examples of the cocatalysts 12 of the photocatalyst at a hydrogen generation side specifically include Pt, Pd, Rh, Ru, Ni, Au, Fe, NiO, $RuO_2$, and Cr—Rh oxide.

Examples of the cocatalysts 12 of the photocatalyst at an oxygen generation side specifically include $IrO_2$, Pt, Co, Fe, C, Ni, Ag, and spinel compounds containing Ni, Fe, Co or Mn, such as MnO, $MnO_2$, $Mn_2O_3$, $Mn_3O_4$, CoO, $Co_3O_4$, $NiCo_2O_4$, $NiFe_2O_4$, $CoFe_2O_4$ and $MnCo_2O_4$.

However, the cocatalysts are not limited to those materials.

The photocatalyst layer 10 may contain other components in a range that the advantages of the present invention are not impaired. Examples of the components that can be contained include hydrophilic materials that do not have absorption in a visible light region, for example, metal oxides such as $Al_2O_3$, $Bi_2O_3$, BeO, $CeO_2$, $Ga_2O_3$, GeO, $GeO_2$, $La_2O_3$, MgO, $Nb_2O_3$, $Sb_2O_3$, $Sb_2O_5$, $Sc_2O_3$, $SiO_2$, $Sm_2O_3$, $SnO_2$, $TiO_2$, ZnO, $ZrO_2$, $Y_2O_3$ and $WO_3$; composite oxides such as $SiO_2$—$Al_2O_3$ and $ZrO_2$—$Al_2O_3$; zeolite; and heteropolyacids.

The photocatalyst layer 10 preferably has smaller thickness. Particularly, it is preferred that the number of stack of the photocatalyst particles 11 in a lamination direction of the photocatalyst layer 10 and the contact layer 20 is from 1 to 3. By this, many light-receivable photocatalyst particles 11 come in contact with the contact layer 20, the thickness of the photocatalyst layer 10 is decreased, and resistance between the photocatalyst particles 11 can be decreased. As a result, photoelectric conversion efficiency can be improved.

The term "the number of stack of the photocatalyst particles in a lamination direction of the photocatalyst layer and the contact layer" means the number of stack of the photocatalyst particles 11 acting as photocatalyst. The photocatalyst particles 11 may directly come in contact with the contact layer 20 and may directly come in contact with the photocatalyst particles 11 embedded in the contact layer 20, but the photocatalyst particles 11 embedded in the contact layer 20 are not included in the number of stack.

"The number of stack of the photocatalyst particles in a lamination direction of the photocatalyst layer and the contact layer" is obtained by observing a cross-section in a lamination direction of the electrode for water-splitting reaction with SEM (Scanning Electron Microscope) and SEM-EDX (Scanning Electron Microscope/Energy Dispersive X-ray Spectroscopy).

The specific measurement method is that a cross-section of a sample (hereinafter sometimes simply referred to as a "cross-section") in which a central part of the electrode for water splitting reaction to be measured has been cut in a lamination direction, is observed with SEM, and the number of photocatalyst particles stacked on the outermost surface is visually measured. It confirms by SEM-EDX that the particles stacked on the outermost surface are the component of the photocatalyst supported. The measurement with SEM is conducted by selecting 3 to 5 optional regions each having 10 μm×10 μm in the cross-section. The regions are not selected at the electrode edge, but at the central part of the electrode, in which unevenness in thickness of the photocatalyst layer is small.

The photocatalyst layer 10 may contain semiconductor or good conductor described hereinafter. In this case, the semiconductor or the good conductor is preferably eccentrically located at a contact layer 20 side than a side (light receiving face side) opposite the contact layer 20, of the photocatalyst layer 10 (that is, the amount of the semiconductor or the good conductor present at the light receiving face side is relatively small than the contact layer 20 side). This can inhibit absorption or reflection of light by the semiconductor or the good conductor, thereby improving photoelectric conversion efficiency.

(Contact Layer 20)

The contact layer 20 is a layer containing semiconductor or good conductor. Materials showing good electroconductivity and not catalyzing reverse reaction of water splitting reaction and reaction pairing the water splitting reaction of photocatalyst can be used as the semiconductor or the good conductor.

Examples of the materials specifically include Au, C, Cu, Cd, Co, Cr, Fe, Ga, Ge, Hg, Ir, In, Mn, Mo, Nb, Pb, Ru, Re, Rh, Sn, Sb, Ta, Ti, V, W, TiN, $TiO_2$, $Ta_3N_5$, TaON, ZnO, $SnO_2$, Indium Tin Oxide (ITO), SnO, $TiO_2$(:Nb), $SrTiO_3$(:Nb), fluorine-doped tin oxide (FTO), $CuAlO_2$, $CuGaO_2$, $CuInO_2$, ZnO, ZnO(:Al), ZnO(:Ga), ZnO(:In), GaN, GaN(:C), GaN(:Si), GaN(:Sn), and their alloys and mixtures. However, the materials are not limited to the materials exemplified above. When the contact layer 20 is formed by sputtering as described after, the contact layer is preferably a layer comprising a metal such as Au, Nb, Ta, Ti or Zr.

In the present specification, the description of "α(:β)" means that a is doped with β. For example, $TiO_2$(:Nb) means that $TiO_2$ is doped with Nb.

The contact layer 20 is provided along a surface shape at a current collecting layer 30 side of the photocatalyst layer 10. That is, the contact layer 20 has the form of covering the side opposite the light receiving face of the photocatalyst layer 10. This form achieves that the photocatalyst particles 11 in the photocatalyst layer 10 are directly contacted with the contact layer 20. As a result, conductive path between the photocatalyst layer 10 and the current collecting layer 30 is increased, thereby improving photoelectric conversion efficiency. Furthermore, the photocatalyst layer 10 and the contact layer 20 are strongly bonded to each other, and this can inhibit that the photocatalyst particles 11 easily drop out of the contact layer 20.

The photocatalyst layer 10 may contain the same semiconductor or good conductor contained in the contact layer 20, or similar semiconductor or good conductor, as described above. It is preferred that the contact layer 20 is not provided at a light receiving face side of the photocatalyst layer 10. This can inhibit absorption or reflection of light by semiconductor or good conductor, thereby improving photoelectric conversion efficiency.

The thickness of the contact layer 20 is not particularly limited so long as the thickness is the degree of capable of covering the side opposite of the light receiving face of the photocatalyst layer 10. For example, the lower limit is 0.3 nm or more, preferably 1 nm or more, and more preferably 10 nm or more, and the upper limit is generally 1 mm or less.

In the present invention, strength of the contact layer 20 is increased as the thickness of the contact layer 20 is increased. For example, if the contact layer 20 has strength to such an extent that the contact layer 20 can be independently handled by increasing the thickness of the contact layer 20, the electrode for water-splitting reaction can be constituted without providing the current collecting layer 30 described hereinafter. In other words, the contact layer 20 and the current collecting layer 30 may be an integrated layer constituted of the same material.

(Current Collecting Layer 30)

The current collecting layer 30 is a layer containing a metal or non-metal. More specifically, the current collecting layer 30 comprises a metal or a conductive material formed by a non-metal conductive material such as carbon (graphite), oxide conductor, or a conductive film containing a conductive material. Above all, the current collecting layer 30 preferably comprises a single substance of an element showing good electroconductivity or an alloy thereof.

Examples of a single substance of an element specifically include Al, Au, Cu, Mo, Ni, Pd, Pt, Ti and W. On the other hand, examples of an alloy specifically include stainless steel, carbon steel titanium alloy and aluminum alloy. However, the current collecting layer is not limited to the materials exemplified above. The current collecting layer preferably comprises titanium or titanium alloy from that the layer is stable in a wide pH range in an electrolyte aqueous solution and shows high electroconductivity, and from the standpoints of costs of material and easy availability.

In the electrode 100 for water-splitting reaction, the current collecting layer 30 has the form covering the side opposite the photocatalyst layer 10 of the contact layer 20. The thickness of the current collecting layer 30 is not particularly limited so long as the thickness is the degree capable of functioning as an electrode for water-splitting reaction. From the standpoints of formation method of a material and costs, the lower limit is 0.1 μm or more, and preferably 1 μm or more, and the upper limit is 10 mm or less, and preferably 5 mm or less.

Thus, the electrode 100 for water-splitting reaction can increase conductive path between the photocatalyst layer and the current collecting layer without inhibiting light absorption by photocatalyst, by providing the contact layer 20 containing semiconductor or good conductor between the photocatalyst layer 10 and the current collecting layer 30 and providing the contact layer 20 along a surface shape at the current collecting layer 30 side of the photocatalyst layer 10, and can improve photoelectric conversion efficiency.

The electrode for water-splitting reaction according to the present invention has excellent photoelectric conversion performance that has not been obtained in the conventional electrode for water-splitting reaction. Specifically, photocurrent density in measurement potential 1V (vs. RHE) is 350 μA/cm$^2$ or more, preferably 400 μA/cm$^2$ or more, and more preferably 500 μA/cm$^2$ or more. The electrode for water-splitting reaction having such excellent photoelectric conversion efficiency can be easily produced as follows.

<Production Method of Electrode for Water-Splitting Reaction>

Figure 3:
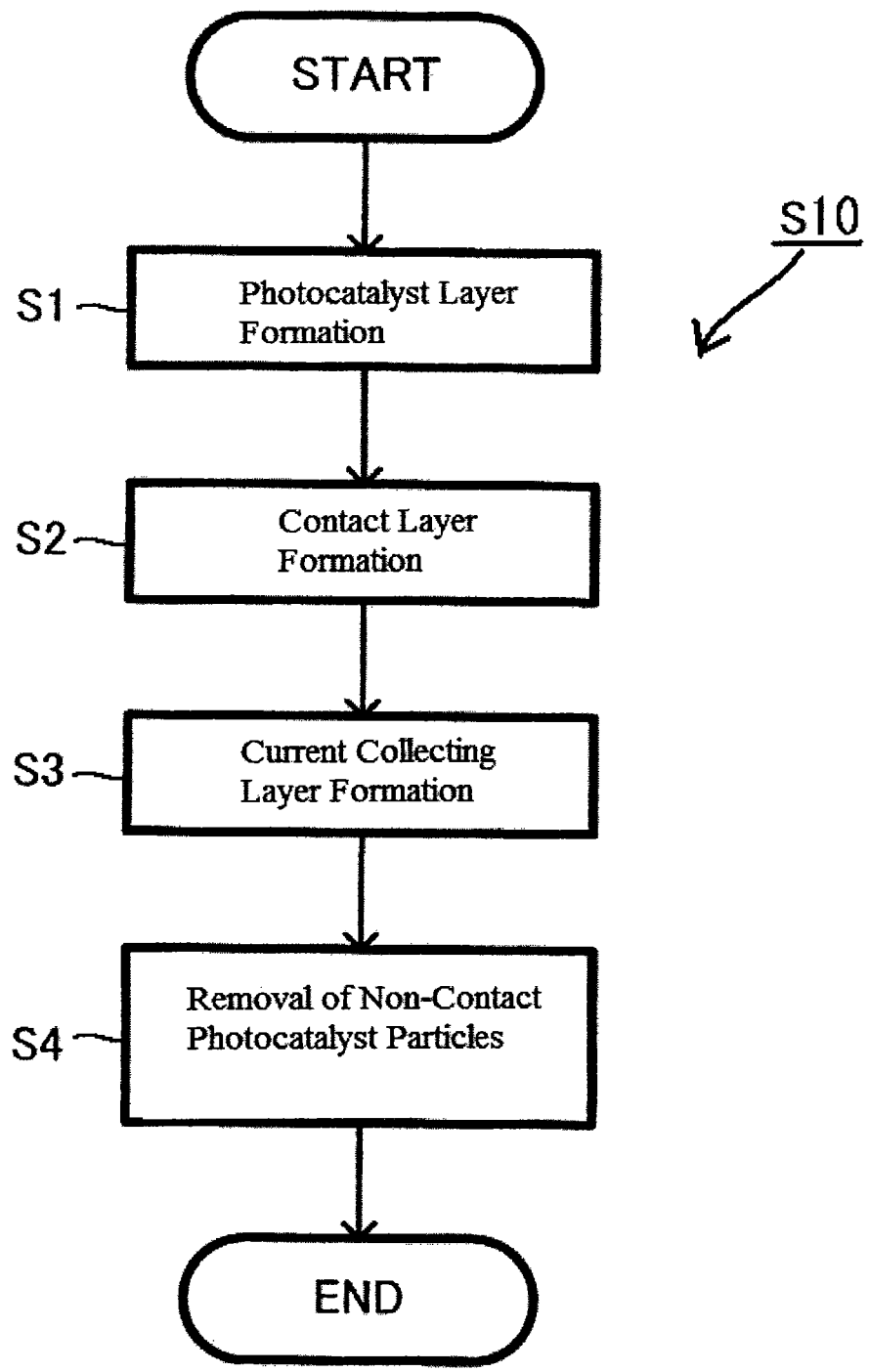
FIG. 3 is a view for explaining a production method (S10) of the electrode for water-splitting reaction of the present invention according to one embodiment.

The order of each step of a production method S10 of the electrode for water-splitting reaction according to one embodiment is shown in FIG. 3. Schematic views for explaining the production process of the electrode for water-splitting reaction of the present invention according to one embodiment are shown in FIGS. 4 to 8. The production method S10 is described below with reference to FIG. 3 and FIGS. 4 to 8 as appropriate.

As shown in FIG. 3, the production method S10 comprises a photocatalyst layer formation step S1 of forming a photocatalyst layer, a contact layer formation step S2 of covering one face of the photocatalyst layer with semiconductor or good conductor to form a contact layer, and a current collecting layer formation step S3 of forming a current collecting layer on a face at a side opposite the photocatalyst layer of the contact layer. The production method S10 optionally further comprises a non-contact photocatalyst removal step S4. The non-contact photocatalyst removal step S4 preferably comprises a reinforcing substrate formation step S4a or a cleaning step S4c, as described hereinafter.

<Photocatalyst Layer Formation Step S1>

The step S1 is a step of forming a photocatalyst layer in the form of a thin layer. Method for decreasing thickness of the photocatalyst layer is not particularly limited. Kneading with a binder, decreasing a thickness by pressure molding, decreasing a thickness by laminating photocatalyst on a first substrate, and the like can be applied to the method. In particular, it is preferred to form a photocatalyst layer in the form of a thin layer by laminating the photocatalyst on a first substrate from that a strong thin film can be formed without using a binder and impurities are difficult to incorporate between the photocatalyst and the contact layer.

The reason is that conductive path of an electron may be restricted by that a binder and impurities remain between the photocatalyst particles and the contact layer, and photoelectric conversion efficiency of the electrode for water-splitting reaction obtained may be decreased.

Figure 4A:
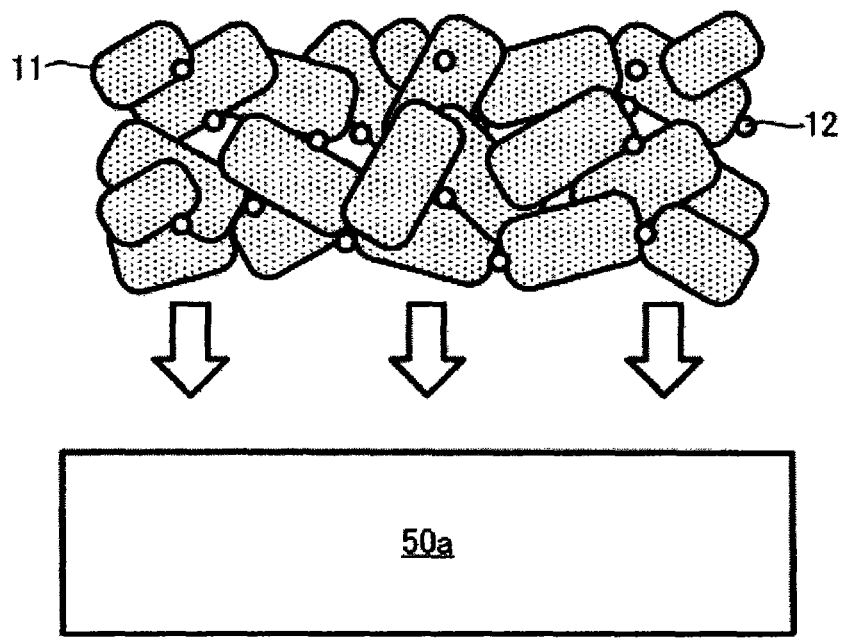
FIG. 4A and FIG. 4B are a view for explaining a production step (S1) of the electrode for water-splitting reaction of the present invention according to one embodiment.
Figure 4B:
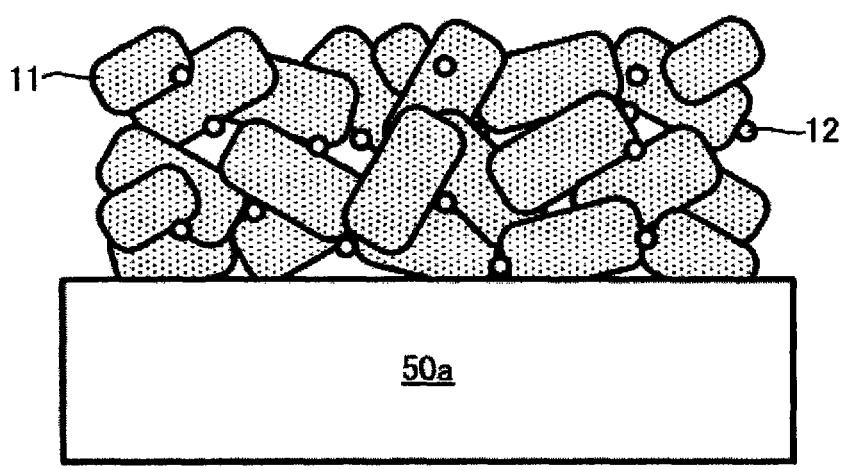

In other words, in the photocatalyst layer formation step S1, the photocatalyst particles 11, and the photocatalyst particles 11 and a substrate 50a are preferably adhered by electrostatic force of the photocatalyst particles. By this, the photocatalyst particles 11 having the cocatalyst 12 supported thereon are laminated on the first substrate 50a as shown in FIG. 4A and FIG. 4B.

A material that is inactive to a reaction with photocatalyst and has excellent chemical stability and heat resistance is selected as the first substrate 50a. Glass plate, Ti plate and Cu plate are particularly preferably used.

Stack of the photocatalyst particles 11 on the first substrate 50a can be conducted by, for example, dispersing the photocatalyst particles 11 in a solvent to obtain a suspension, and applying the suspension to the substrate 50a having been subjected to polishing and cleaning, followed by drying.

Examples of the solvent used include water; alcohols such as methanol and ethanol; ketones such as acetone; and aromatics such as benzene, toluene and xylene. When the photocatalyst particles 11 are dispersed in the solvent, the photocatalyst particles 11 can be uniformly dispersed in the solvent by performing ultrasonic treatment.

A method for applying the suspension to the substrate 50a is not particularly limited. Examples the method include a spraying method, a dipping method, a squeeze method, a doctor blade method, a spin coating method, a screen coating method, a roll coating method and an inkjet method. Also, the examples also include a method of disposing a glass plate on the bottom of container containing the photocatalyst suspension, and withdrawing the solvent from the container after the photocatalyst settles out. Drying conditions after the application are that a temperature higher than the melting point of a solvent is maintained or heating is conducted at a temperature to such an extent that a solvent evaporates in a short period of time (for example, about 15 to 200° C.). In this case, it is preferred to control vaporization rate such that the coating liquid does not flocculate. By this, the photocatalyst particles 11 can be appropriately laminated on the substrate 50a.

(Contact Layer Formation Step S2)

The step S2 is a step of covering one face of the photocatalyst layer with semiconductor or good conductor to form the contact layer. A method of covering with semiconductor or good conductor is not particularly limited. Wet processes such as a spraying method, a spin coating method, an electrophoresis method and a plating method, and dry processes such as a vacuum deposition method and sputtering method can be used as the method.

Of those methods, a vacuum deposition method and a sputtering method in which impurities are difficult to be incorporated between the photocatalyst and the contact layer are preferred, and a sputtering method is particularly preferred in that a contact layer having strong bonding to the photocatalyst particles and being difficult to be peeled can be formed, and the method is easily applied to high melting point metal.

Figure 5A:
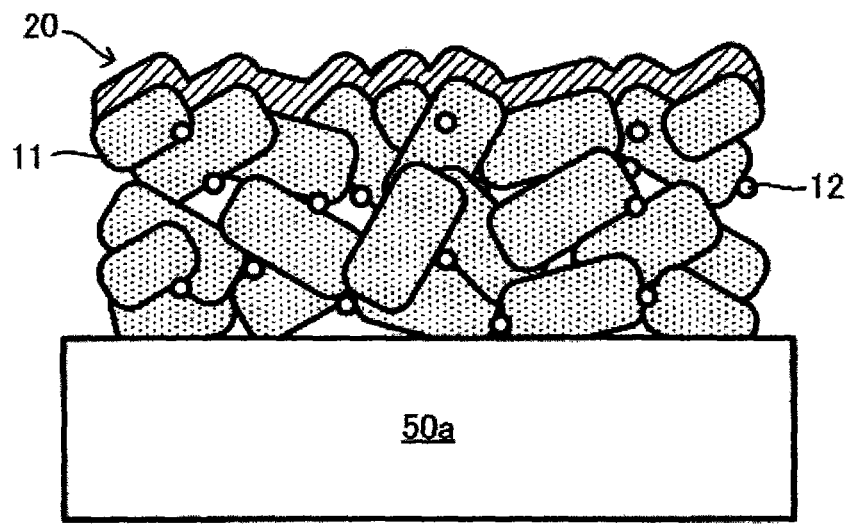
FIG. 5A and FIG. 5B are a view for explaining production steps (S2 and S3) of the electrode for water-splitting reaction of the present invention according to one embodiment.

When the sputtering method is used, the thickness of the contact layer can be easily controlled by adjusting sputtering rate and treatment time. By this, the contact layer 20 can be formed on one face of the photocatalyst layer along the shape thereof as shown in FIG. 5A.

Although the optimum temperature varies depending on the kind of the photocatalyst, semiconductor or good conductor used, the photocatalyst temperature in the contact layer formation step S2 is preferably from about 30 to 500° C. The contact layer formation step may be carried out at low temperature, and after the film formation, heating may be conducted at from 30 to 500° C.

(Current Collecting Layer Formation Step S3)

The step S3 is a step of forming a current collecting layer on a face at a side opposite the photocatalyst layer of the contact layer. A method of forming the current collecting layer on the contact layer is not particularly limited. For example, a sputtering method can be used. In this case, the thickness of the current collecting layer can be easily adjusted by adjusting sputtering rate and treatment time.

Alternatively, the current collecting layer may be formed by applying a conductive adhesive (for example, silver paste or carbon paste) to the contact layer and then adhering a metal or non-metal support becoming the current collecting layer thereto. In this case, the shape of the current collecting layer is not limited to a plate shape, and materials having punching metal shape, mesh shape or lattice shape or a porous body having penetrated fine holes may be used.

Figure 5B:
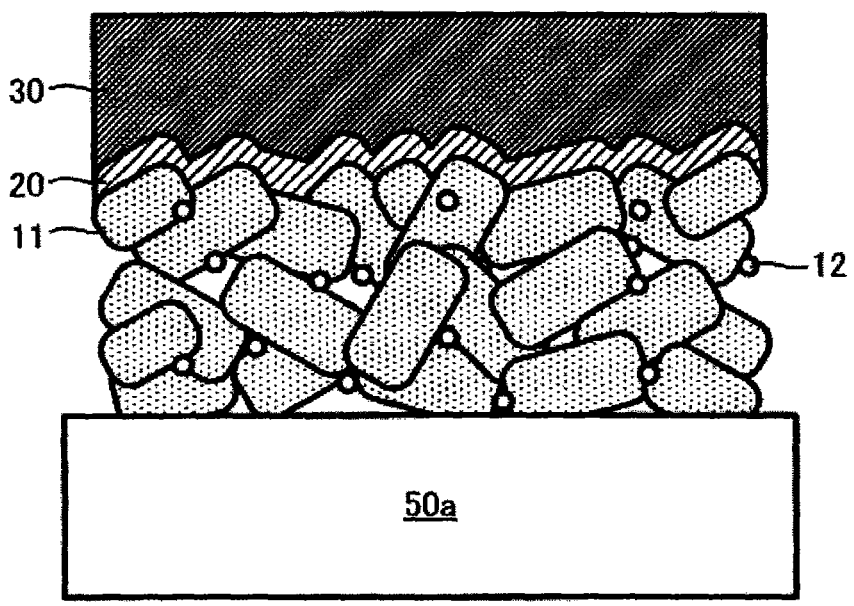

By this, the current collecting layer 30 can be formed on one face of the contact layer 20 as shown in FIG. 5B.

The contact layer 20 and the current correcting layer 30 may be an integrated layer constituted of the same material as described above. That is, the contact layer having sufficient thickness and capable of functioning as a current collecting layer can be formed by conducting sputtering for a long period of time in the step S2. In this case, the step S3 is included in the step S2.

(Non-Contact Photocatalyst Removal Step S4)

The step S4 is a step of removing photocatalyst particles that do not come in contact with the contact layer. The removal method is not particularly limited, and for example, a cleaning step S4c such as ultrasonic cleaning treatment can be applied.

Examples of a cleaning liquid used include water; electrolyte aqueous solution; alcohols such as methanol, ethanol and propanol; aliphatic hydrocarbons such as pentane and hexane; aromatic hydrocarbons such as toluene and xylene;

ketones such as acetone and methyl ethyl ketone; esters such as ethyl acetate; halogenides such as fluorocarbon; ethers such as diethyl ether and tetrahydrofuran; sulfoxides such as dimethylsufoxide; and nitrogen-containing compounds such as dimethyl formamide. Water and soluble compounds such as methanol, ethanol and tetrahydrofuran are preferably used.

The current collecting layer has small thickness. Therefore, where breakage or the like of the electrode for water-splitting reaction is a concern in the step S4, it is preferred that the electrode is subjected to the cleaning step S4c through the reinforcing substrate formation step S4a of providing a second substrate on a face opposite the contact layer of the current collecting layer.

Figure 6:
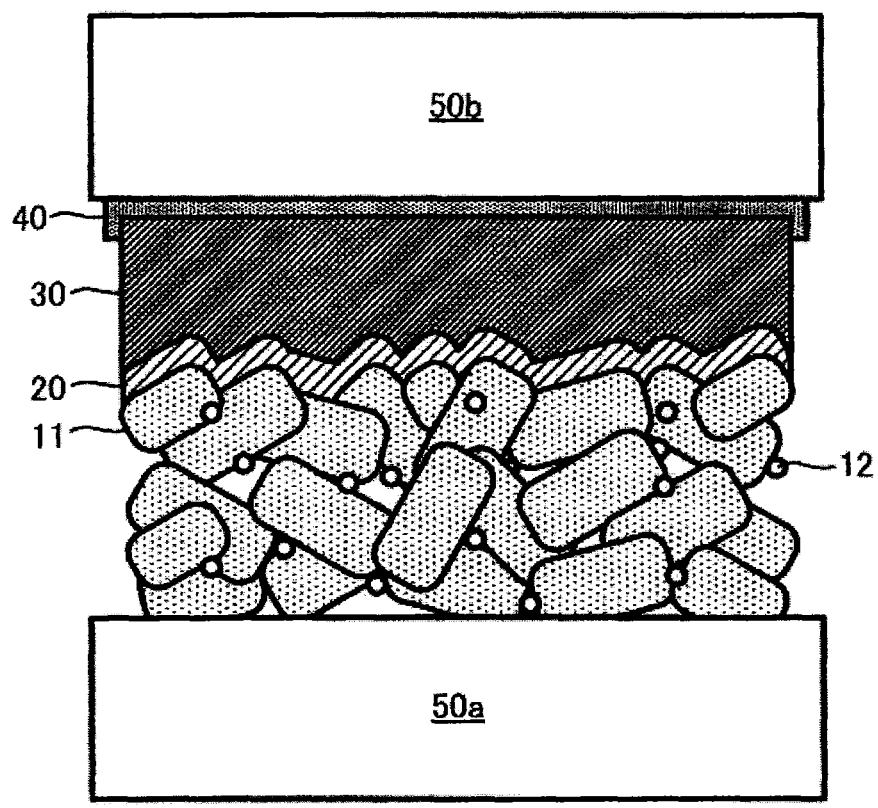
FIG. 6 is a view for explaining a production step (S4a) of the electrode for water-splitting reaction of the present invention according to one embodiment.

The method of providing the second substrate is not particularly limited. Example of the method includes a method of adhering the current collecting layer and the second substrate using an adhesive such as epoxy adhesive. Specifically, a second substrate 50b can be attached to a face opposite the contact layer 20 of the current collecting layer 30 through an adhesive layer 40, as shown in FIG. 6.

Figure 7:
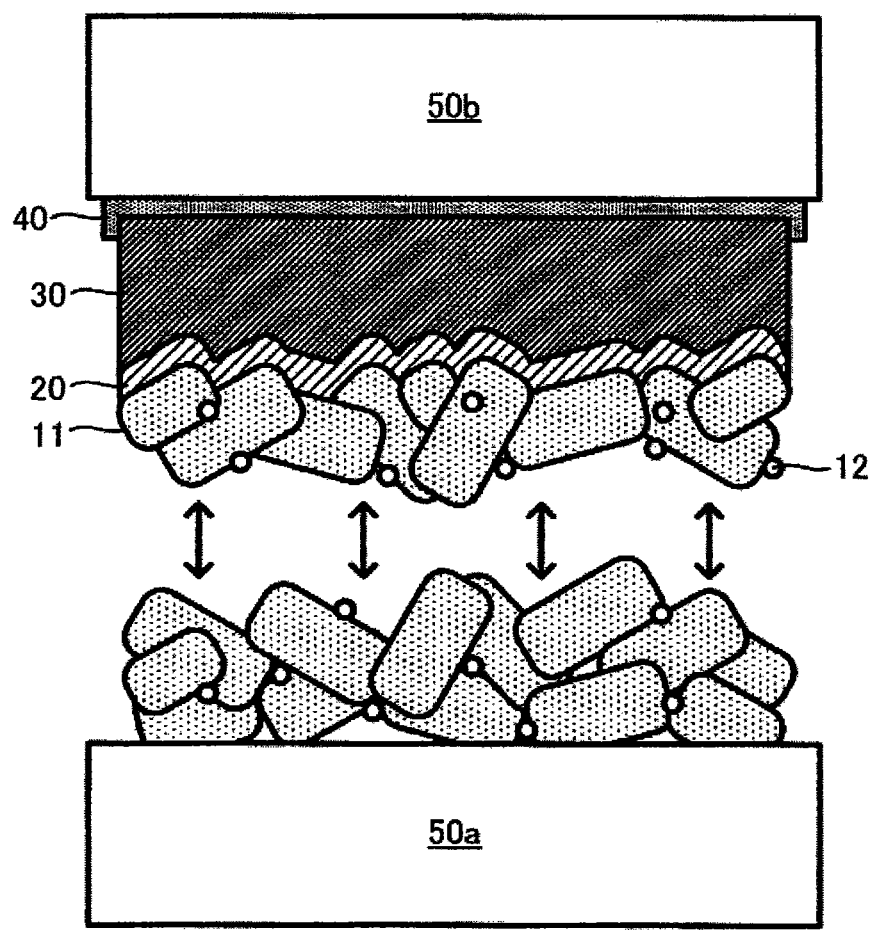
FIG. 7 is a view for explaining a production step (S4b) of the electrode for water-splitting reaction of the present invention according to one embodiment.

When the photocatalyst particles 11 are laminate on the first substrate 50a in the step S1, the photocatalyst particles that do not come in contact with the contact layer 20 are removed by the cleaning step S4c or the like after passing a substrate removal step S4b that removes the first substrate 50a, preferably after the substrate removal step S4b subsequent to the reinforcing substrate formation step S4a, as shown in FIG. 7.

The removal method of the first substrate 50a is not particularly limited. Examples of the removal method that can be used include a method of mechanically peeling the first substrate 50a, a method of removing a substrate by dipping in water to wet a photocatalyst particle stack part, thereby weakening the bonding between the photocatalyst particles, a method of removing a substrate by dissolving the substrate in a chemical such as an acid or an alkali, and a method of removing a substrate by physically destroying the substrate. A method of peeling a substrate is preferred in that the possibility of damage of the photocatalyst layer is low (this case is called a substrate peeling step). The contact layer 20 and a part of the non-contact photocatalyst particles 11 can be physically removed together with the first substrate 50a by the substrate removal step S4b.

On the other hand, the photocatalyst particles 11 that come in contact with the contact layer 20 are physically bonded to a certain extent to the contact layer 20. Therefore, when removing the first substrate 50a, the photocatalyst particles 11 remain at a contact layer 20 side without dropping out. In this case, the non-contact photocatalyst particles that have not been removed in the substrate removal step S4b are preferably further subjected to removal treatment by the cleaning step S4c or the like.

Figure 8:
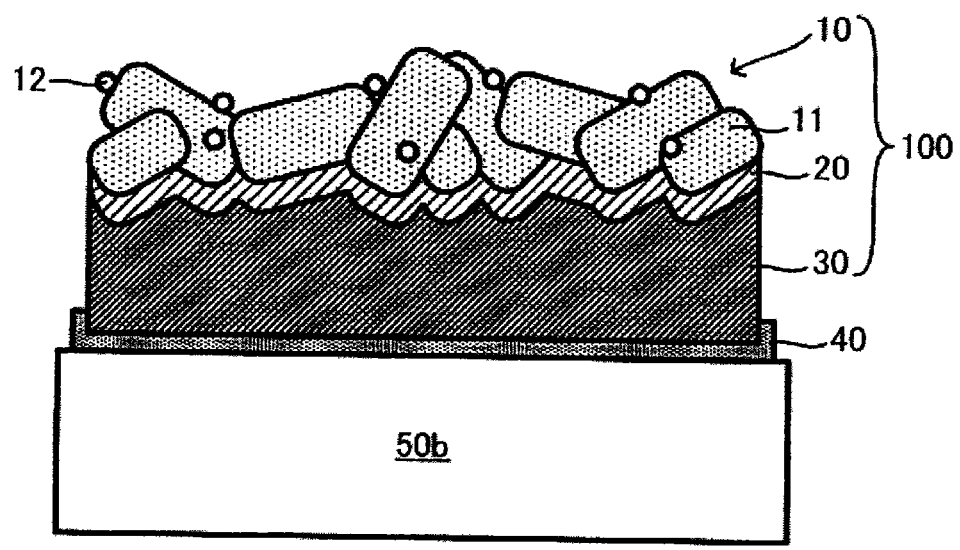
FIG. 8 is a view schematically showing an electrode for water-splitting reaction obtained through the production method (S10) of the electrode for water-splitting reaction of the present invention according to one embodiment.

The electrode for water-splitting reaction according to the present invention can be easily produced by passing the above steps S1 to S3 and optionally the step S4. For example, as shown in FIG. 8, the electrode 100 for water-splitting reaction of the present invention according to one embodiment can be provided on the second substrate 50b through an adhesive layer 40.

Thus, the production method S10 of an electrode for water-splitting reaction according to the present invention is characterized by forming a photocatalyst layer, forming a contact layer and then forming a current collecting layer. By this constitution, the contact layer can be provided along a face shape of the photocatalyst layer, and the photocatalyst particles in the photocatalyst layer and the contact layer are directly contacted to each other. As a result, conductive path between the photocatalyst layer and the current collecting layer can be increased.

Furthermore, according to the production method S10 of an electrode for water-splitting reaction according to the present invention, the semiconductor or good conductor contained in the photocatalyst layer can be eccentrically located at a contact layer side than a side (light receiving face side) opposite the contact layer of the photocatalyst layer (that is, the amount of the semiconductor or good conductor present at the light receiving face side is decreased). By this, absorption or reflection of light by semiconductor or good conductor can be inhibited, light absorption by the photocatalyst is not disturbed, and photoelectric conversion efficiency can be improved.

Furthermore, according to the production method S10 of an electrode for water-splitting reaction according to the present invention, the thickness of the photocatalyst layer can be decreased (for example, a form that only one to three layers of photocatalyst particles are laminated), and light receivable photocatalyst particles come in contact with the contact layer. As a result, resistance between photocatalyst particles can be decreased, and photoelectric conversion efficiency can be further improved.

The surface of electrode for water-splitting reaction obtained by the above method can be further modified with $TiO_2$, $Al_2O_3$ or the like. The modification method is not particularly limited, but, for example, an electron layer deposition (ALD) method can be utilized.

<Hydrogen Production Method>

Production method of hydrogen according to the present invention is described below.

The production method of hydrogen according to the present invention is characterized that the electrode for water-splitting reaction of the present invention dipped in water or an electrolyte aqueous solution is irradiated with light to perform water-splitting, thereby producing hydrogen.

The method for producing hydrogen by water-splitting is not particularly limited, but there are a method of recovering hydrogen and oxygen generated together or separately, and then separating those, and a method of generating hydrogen and oxygen separately and recovering those individually. The method of generating hydrogen and oxygen separately and recovering those individually is generally used.

Specifically, hydrogen is produced using a two electrode system water-splitting reaction apparatus having an anode and a cathode, at least one of those being the electrode for water-splitting reaction of the present invention. The two electrode system water-splitting reaction apparatus is preferred in that it is not necessary to separate hydrogen and oxygen, since hydrogen and oxygen are generated in two water-splitting tanks partitioned by a diaphragm, respectively.

The production method by the two electrode system water-splitting reaction apparatus shown in FIG. 1 is described below as an example.

FIG. 1 is an example of an apparatus in the case of using the electrode for water-splitting reaction of the present invention as the anode 61.

In the water-splitting reaction apparatus, when providing the explanation in the case of using an acidic aqueous solution as the water or the electrolyte aqueous solution 65 as a example, by irradiating the anode 61 with light such as sunlight entered through a transmissive window (not shown) provided on a water-splitting tank having water or the electrolyte aqueous solution 65 therein, charge separation of photocatalyst occurs, thereby an electron ($e^-$) and a hole ($h^+$) are formed. The hole generated oxidizes water to form an oxygen molecule and a proton. The oxygen molecule formed is recovered through an upper gas recovery port by gas-liquid separation. The proton formed is conveyed to the cathode 63 side through the diaphragm 62.

On the other hand, the electron excited in a conduction band migrates into the cathode 63 by conducting through a conductor 64. The electron and proton migrated into the cathode 63 are reacted with each other by the cathode 63 having hydrogen generation catalytic ability, and a hydrogen molecule is formed. The hydrogen molecule formed is recovered through an upper gas recovery port by gas-liquid separation.

In the water-splitting reaction apparatus, hydrogen can be also produced using the electrode for water-splitting reaction of the present invention in the cathode 63. In this case, by irradiating the cathode 63 with light entered through the transmissive window (not shown) provided at a cathode 63 side, charge separation of the photocatalyst occurs, and an electron and a hole are formed. The electron excited reduces a proton in an aqueous solution to form a hydrogen molecule. The hydrogen molecule is recovered through an upper gas recovery port by gas-liquid separation.

On the other hand, to compensate the hole formed in the photocatalyst of the cathode 63, electron migration occurs from the anode 61 to the cathode 63 through the conductor 64. As a result, oxidation reaction of water occurs in the anode 61, an oxygen molecule and a proton are formed, and the proton formed migrates to a cathode 63 side through the diaphragm 62. The oxygen molecule formed is recovered through an upper gas recover port.

The electrode for water-splitting reaction of the present invention may be used in both the anode 61 and the cathode 63. In this case, by irradiating both the anode 61 and the cathode 63 with light, the above reaction occurs, and hydrogen can be produced.

The anode 61 is an electrode having oxidation function. The electrode in the case that the electrode for water-splitting reaction of the present invention is not used in the anode 61 is not particularly limited. A catalyst having ability capable of oxidizing water or a hydroxide ion into an oxygen molecule is generally used. Specifically, the examples include $IrO_2$, Pt, Co, Fe, C, Ni, Ag, and spinel compounds containing Ni, Fe, Co or Mn, such as MnO, $MnO_2$, $Mn_2O_3$, $Mn_3O_4$, CoO, $Co_3O_4$, $NiCo_2O_4$, $NiFe_2O_4$, $CoFe_2O_4$ and $MnCo_2O_4$. Those catalysts are the same as exemplified as the cocatalysts at an oxygen generation side among the above-mentioned cocatalysts 12.

The anode 61 can use a photocatalyst that is not the electrode for water-splitting reaction of the present invention. In other words, the anode 61 can use a photocatalyst in which a potential of a hole formed by irradiation with light is more positive than a potential that can oxidize a hydroxide ion into an oxygen molecule.

The cathode 63 is an electrode having reduction function. An electrode in the case that the electrode for water-splitting reaction of the present invention is not used in the cathode 63 is not particularly limited. A catalyst having ability capable of reducing water or a proton into a hydrogen molecule is generally used. Specifically, Pt, Pd, Rh, Ru, Ni, Au, Fe, NiO, $RuO_2$ and Cr—Rh oxide can be exemplified. Those catalysts are the same as exemplified as cocatalysts at a hydrogen generation side among the above-mentioned cocatalysts 12.

The cathode 63 can use a photocatalyst that is not the electrode for water-splitting reaction of the present invention. In other words, the cathode 63 can use a photocatalyst in which a potential of an electron formed by irradiation with light is more negative than a potential that can reduce a water molecule or a hydrogen ion into a hydrogen molecule.

The anode 61 and/or the cathode 63 may directly use the above-mentioned materials. However, the materials can be used by using metals such as Al, Au, Cu, Mo, Ni, Pd, Pt, Ti and W; alloys such as stainless steel, carbon steel, titanium alloy and aluminum alloy; high conductive carbon materials such as glassy carbon and graphite; and the like as a support, and fixing the materials to those supports. Above all, from that it is stable in a wide pH range and shows high electro-conductivity, in an electrolyte aqueous solution, it is preferred to use metallic titanium, titanium alloy, glassy carbon, graphite and the like as a support.

The diaphragm 62 is not particularly limited so long as it can partition an anode and a cathode and migration of a proton generated at an anode side is possible. For example, an ion-exchange membrane, silica membrane, a zeolite membrane, a salt bridge and the like can be used, and an ion exchange membrane and a salt bridge are generally used.

The conductor 64 is not particularly limited so long as it is constituted of a member capable of conducting an electron. Good conductors such as copper, gold, and graphite are generally used.

Water and the electrolyte aqueous solution are not particularly limited so long as it can be decomposed by irradiation with light to generate hydrogen and oxygen. Pure water, and an aqueous solution containing a cation such as alkali metal ion or alkaline earth metal ion, or an anion such as chloride ion, sulfate ion or nitrate ion are exemplified. Of those anions and cations, it is preferred to use sodium sulfate $Na_2SO_4$ as an electrolyte from the standpoint that the aqueous solution is near neutral and does not form a by-product such as chlorine gas.

The pH of water or the electrolyte aqueous solution 65 is not particularly limited. However, the pH is preferably a range of from 2 to 14 from, for example, that the damage to the inside of the water-splitting reaction apparatus, for example, the water-splitting tank and the electrode for water-splitting reaction, is small while maintaining stability of the photocatalyst used in the electrode for water-splitting reaction. The temperature of water and the electrolyte aqueous solution 65 is not particularly limited. Low temperature is preferred for high reaction efficiency. The temperature is generally from 0 to 100° C.

The light that irradiates the electrode for water-splitting reaction in water or the electrolyte aqueous solution 65 is not particularly limited, and light capable of causing water-splitting reaction can be used. Specifically, visible light such as sunlight, ultraviolet light, infrared light and the like can be utilized. Light containing visible light is preferred from that energy is large, and above all, sunlight that its amount is inexhaustible is more preferred.

The wavelength of the irradiation light is not particularly limited. The wavelength is generally from 200 nm to 1,000 nm.

Example

The present invention is described more specifically below by reference to examples, but the invention is not limited by the following examples and various modifications can be made in a range within the scope thereof.

(Method of Obtaining the Number of Stack of Photocatalyst Particles of Photocatalyst Layer)

An electrode to be evaluated is cut in a lamination direction so as to pass through a central part of the electrode, and a cross-section of the electrode laminated is observed. It confirms that surface particles are photocatalyst particles by the measurement with the following SEM-EDX. Three to five regions each having 10 μm×10 μm on the cross-section are selected, and observed with the following SEM, and the number of stack of photocatalyst particles in the photocatalyst layer is visually measured. An average value of the measurement results is used as the number of stack.
(SEM)
Apparatus: S-4700, manufactured by Hitachi, Ltd.
Accelerating voltage: 10 kV or 20 kV
(SEM-EDX)
Apparatus: (SEM) JSM-7600F, manufactured by JASCO Corporation
(EDX) Manufactured by Thermo Fisher Scientific
SEM accelerating voltage: 15 kV
EDX measurement range: 10 mm$^2$
<Preparation of Photocatalyst>
(Preparation of LaTiO$_2$N)

LaTiO$_2$N was prepared according to the method described in Journal of Flux Growth, 2010, 5, 81.

La$_2$O$_3$ and TiO$_2$ (all 99.99%) were mixed in a molar ratio of 1:1, and the resulting mixture was mixed with NaCl as a flux. The resulting mixture was heated at 1,423K for 5 hours using an alumina crucible, and then cooled to 1,023K in a rate of 1K/min. NaCl was removed from a white bulk obtained, by dissolution with distilled water, thereby obtaining La$_2$TiO$_7$ becoming a precursor. La$_2$TiO$_7$ obtained was heated at 1,223K for 3 hours in NH$_3$ stream of 250 mL/min to conduct nitridation treatment, thereby obtaining LaTiO$_2$N. As a result of confirmation with XRD, formation of LaTiO$_2$N was confirmed.
(Preparation of IrO$_2$/LaTiO$_2$N)

LaTiO$_2$N (0.1 g) obtained above was stirred for 3 hours in a solution containing IrO$_2$ colloid (5.0 mass % of IrO$_2$ to LaTiO$_2$N, pH was adjusted to 5.0 using NaOH aqueous solution) to support IrO$_2$ on LaTiO$_2$N.

The IrO$_2$ colloid solution was prepared according to the method described in J. Phys. Chem. Lett., 2011, 2, 402. Specifically, Na$_2$[IrCl$_6$].6H$_2$O (0.056 g) was dissolved in 50 mL distilled water, and pH was adjusted to 12.0. The resulting solution was heated in a water bath at 80° C. for 20 minutes to obtain a light blue solution. The solution was iced, and 1 mL of an iced 3M HNO$_3$ aqueous solution was added dropwise thereto. Stirring was conducted for 80 minutes while icing, and a deep blue IrO$_2$ colloid solution was obtained.
(Preparation of Ta$_3$N$_5$)

Ta$_2$O$_5$ (99.9%, manufactured by Rare Metallic Co., Ltd.) was heated to 1,123K in a rate of 10K/min in NH$_3$ stream of 500 mL/min, maintained at the temperature for 15 hours, and then cooled to room temperature, thereby obtaining Ta$_3$N$_5$. As a result of confirmation with XRD and EDX, the formation of Ta$_3$N$_5$ was confirmed.
(Preparation of Ta$_3$N$_5$:Mg, Zr)

Ta$_2$O$_5$, Mg(NO$_3$)$_2$.6H$_2$O and Zr(NO$_3$)$_2$.2H$_2$O were mixed in a molar ratio of 1:2/9:4/9, a small amount of ethanol was added thereto, and the resulting mixture was ground and mixed until the mixture dries. The same operation was again conducted to perform mixing. The mixture was burned at 923K for 1 hour in air atmosphere to obtain a composite oxide precursor of Ta, Mg and Zr. Na$_2$CO$_3$ was added to the precursor obtained so as to achieve a molar ratio of (Ta+Mg+Zr):Na=1:1, and the resulting mixture was ground and mixed in a mortar. The resulting mixture was heated to 1,173K at a rate of 10K/min in NH$_3$ stream of 200 mL/min, and maintained at the temperature for 20 hours. The mixture was cooled to room temperature to obtain Mg/Zr-doped Ta$_3$N$_5$ (Ta$_3$N$_5$:Mg, Zr). As a result of confirmation with XRD and EDX, formation of Ta$_3$N$_5$ was confirmed.

Preparation of Electrode for Water-Splitting Reaction

Example 1

IrO$_2$/LaTiO$_2$N (30 mg) obtained above was suspended in 1 mL of 2-propanol, the suspension (20 μL) was added dropwise on a first glass substrate (soda lime glass), and drying was repeated three times to form 10 mm×10 mm photocatalyst layer.

Nb becoming a contact layer was laminated by a sputtering method. An apparatus used was a mini-sputtering equipment (MNS-2000-RF) manufactured by ULVAC, Inc., treatment time was 5 minutes at 150 W, and substrate temperature was 623K. As a result of observation with SEM, the thickness of the contact layer obtained under the conditions was 120 nm.

Ti becoming a current collecting layer was laminated by a sputtering method. Treatment time was 3 hours at 150 W. An electrode having Ti laminated thereon was taken out, and a second glass substrate (soda lime glass) was adhered to the current collecting layer using an epoxy resin. Finally, the first glass substrate was peeled, and ultrasonic cleaning was conducted in pure water for 10 minutes. Thus, (IrO$_2$/LaTiO$_2$N)/Nb/Ti electrode was obtained.

Using the electrode obtained, photocurrent density was measured according to "Evaluation of electrode" described hereinafter. The results obtained are shown in Table 1.

Examples 2 and 3

(IrO$_2$/LaTiO$_2$N)/Ta/Ti electrode was obtained in the same manner as in Example 1 except that Ta was laminated in place of Nb becoming a contact layer and Ti was then laminated. In Example 2, pH of the electrolyte solution at the measurement of photocurrent density was 5.9, and in Example 3, the pH thereof was 13.5. The results obtained are shown in Table 1.

Example 4

(IrO$_2$/LaTiO$_2$N)/Ti/Ti electrode was obtained in the same manner as in Example 1 except that Ti was laminated in place of Nb becoming a contact layer (contact layer and current collecting layer were integrated in one boy), and photocurrent density was measured. The result obtained is shown in Table 1.

Example 5

(IrO$_2$/LaTiO$_2$N)/Zr/Ti electrode was obtained in the same manner as in Example 1 except that Zr was laminated in place of Nb becoming a contact layer. The result obtained is shown in Table 1.

Example 6

(IrO$_2$/LaTiO$_2$N)/Au/Ti electrode was obtained in the same manner as in Example 1 except that Au was laminated in place of Nb becoming a contact layer. The result obtained is shown in Table 1.

Example 7

The Mg/Zr-doped Ta$_3$N$_5$ (50 mg) described above was added to 45 mL of toluene and 5 mL of 1-dodecanol, and the resulting suspension was refluxed at 120° C. in nitrogen atmosphere to hydrophobize particles. The particles were arranged on a Cu plate in the form of single particle using Langmuir Blodgett method, and treated for 1 minute in a distance to UV light source of 1 cm using UV ozone cleaning modification experimental equipment (ASM401N, manufactured by Asumi Giken, Limited). Ti was deposited by a sputtering method to form a contact layer. $Ta_3N_5$ particles were transferred to a Ti plate having a conductive adhesive (Pyro-Duct 599 (graphite base), manufactured by AREMUCO; hereinafter referred to as "PD599") spin-coated thereon from the Cu plate. Lead line was connected to the Ti plate, and unnecessary portion was covered with an epoxy resin. Thus, $Ta_3N_5$/Ti/PD599-Ti electrode was prepared.

Using the electrode obtained, photocurrent density was measured according to "Evaluation of electrode" described hereinafter. The result obtained is shown in Table 1.

Example 8

$Ta_3N_5$ (30 mg) obtained above was suspended in 1 mL of 2-propanol, 20 μL of the resulting suspension was added dropwise to a first glass substrate (soda lime glass), and drying was repeated three times to form a photocatalyst layer of 10 mm×10 mm.

Nb constituting a contact layer was laminated by a sputtering method. An apparatus used was a mini-sputtering equipment (MNS-2000-RF) manufactured by ULVAC, Inc., treatment time was 5 minutes at 100 W, and substrate temperature was 573K.

Ti constituting a current collecting layer was laminated by a sputtering method. Treatment time was 3 hours at 200 W. An electrode having Ti laminated thereon was taken out, and a second glass substrate (soda lime glass) was adhered to the current collecting layer using an epoxy resin. Finally, the first substrate was peeled, and ultrasonic cleaning was conducted in pure water for 10 minutes. Thus, $Ta_3O_5$/Nb/Ti electrode was obtained.

Subsequently, 0.1M ammonia aqueous solution was added dropwise to 0.01M cobalt nitrate aqueous solution until reaching pH=8.5 to prepare a solution having cobalt amine complex formed therein. The $Ta_3O_5$Nb/Ti electrode was dipped in the solution for one hour to support CoOx as a cocatalyst thereon. Thus, an electrode was obtained.

Using the electrode obtained, photocurrent density was measured according to <Evaluation of electrode> described hereinafter. The results are shown in Table 2.

Example 9

In Example 8, the surface of the $Ta_3O_5$/Nb/Ti electrode before supporting CoCx thereon was modified with $TiO_2$ by an atomic layer decomposition (ALD) method (apparatus used: SAL100H, manufactured by Kan Manufactory Co., Ltd.). Titanium isopropoxide (Japan Advanced Chemicals) and water were used as precursors, and film formation was performed at a sample temperature of 373K. Thereafter, CoCx as a cocatalyst was supported in the same manner as in Example 8. Thus, an electrode was obtained.

Using the electrode obtained, photocurrent density was measured according to <Evaluation of electrode> described hereinafter. The results are shown in Table 2.

Comparative Example 1

A suspension of the above-described $LaTiO_2N$ powder, acetone and iodine was prepared, FTO (fluorine-doped tin oxide) plate was dipped in the suspension, and a voltage of 100 V was applied for 10 second using the FTO plate as a counter electrode, thereby preparing $LaTiO_2N$/FTO electrode. 30 μL of 20 mM $TiCl_4$/methanol solution was added dropwise to the $LaTiO_2N$/FTO electrode obtained, followed by drying at 250° C. for 1 minute in air atmosphere. The dipping treatment and drying treatment were repeated several times to adsorb $TiCl_4$ on the surface of the $LaTiO_2N$/FTO electrode. The electrode having $TiCl_4$ adsorbed thereon was subjected to nitridation treatment at 500° C. for 1 hour in $NH_3$ stream of 50 mL/min to obtain $LaTiO_2N$/TiN/FTO electrode having TiN introduced in a photocatalyst layer. The $LaTiO_2N$/TiN/FTO electrode was dipped in a solution containing the above-described $IrO_2$ colloid for 3 hours while stirring to obtain ($IrO_2$/$LaTiO_2N$)/TiN/FTO electrode supporting 4 wt % of $IrO_2$.

Using the electrode obtained, photocurrent density was measured according to "Evaluation of electrode" described hereinafter. The result obtained is shown in Table 1.

Comparative Example 2

$Ta_3N_5$:Mg,Zr/PD599-Ti electrode was obtained in the same manner as in Example 7 except that Ti becoming a contact layer was not laminated, and photocurrent density was measured. The result obtained is shown in Table 1.

<Evaluation of Electrode>
(Photocurrent Density)

Evaluation of an electrode prepared was performed by current-potential measurement in three electrode system using a potentiostat. A separable flask having a planar window was used as an electrochemical cell, Ag/AgCl electrode was used as a reference electrode, and Pt wire was used as a counter electrode. $Na_2SO_4$ (99.0%, manufactured by Wako Pure Chemical Industries, Ltd.) 0.1M aqueous solution having pH adjusted to 5.9 to 13.5 by NaOH (special grade, Taisei Kagaku) was used as an electrolyte solution. Oxygen and carbon dioxide were removed by filling the inside of the electrochemical cell with argon, and sufficiently conducting bubbling before the measurement. In the electrochemical measurement, 300 W xenon lamp equipped with a gold mirror and a cutoff filter (L-42, manufactured by Hoya Corporation), or a solar simulator (AM1.5) was used as a light source, and white light having a wavelength of 420 to 750 nm was emitted from the planar window of the electrochemical cell. Photocurrent density ($\mu A/cm^2$) in measurement potential 1V (vs. RHE) was measured in the respective electrodes. The results obtained are shown in Table 1 below.

TABLE 1

| | Photosemiconductor material | Cocatalsyt | Number of stack of Photocatalyst layer | Contact layer Material | Thickness (nm) | Current collecting layer Material | pH | Photocurrent density* ($\mu A/cm^2$) | Light source |
|---|---|---|---|---|---|---|---|---|---|
| Example 1 | $LaTiO_2N$ | $IrO_2$ | 1 | Nb | 120 | Ti | 5.9 | 1300 | AM1.5 |
| Example 2 | $LaTiO_2N$ | $IrO_2$ | 1 | Ta | 190 | Ti | 5.9 | 1800 | AM1.5 |
| Example 3 | $LaTiO_2N$ | $IrO_2$ | 1 | Ta | 190 | Ti | 13.5 | 5500 | AM1.5 |

TABLE 1-continued

|  | Photosemiconductor material | Cocatalsyt | Number of stack of Photocatalyst layer | Contact layer | | Current collecting layer Material | pH | Photocurrent density* (µA/cm²) | Light source |
|---|---|---|---|---|---|---|---|---|---|
|  |  |  |  | Material | Thickness (nm) |  |  |  |  |
| Example 4 | LaTiO₂N | IrO₂ | 1 | Ti | 160 | Ti | 5.9 | 1100 | AM1.5 |
| Example 5 | LaTiO₂N | IrO₂ | 1 | Zr | 260 | Ti | 5.9 | 1100 | AM1.5 |
| Example 6 | LaTiO₂N | IrO₂ | 1 | Au | 3000 | Au | 5.9 | 2000 | AM1.5 |
| Example 7 | Ta₃N₅:Mg, Zr | None | 1 | Ti | 2200 | PD599-Ti | 6 | 360 | 300 W Xe (λ ≥420 nm) |
| Comparative Example 1 | LaTiO₂N | IrO₂ | 8 | TiN | — | FTO | 5.9 | 300 | AM1.5 |
| Comparative Example 2 | Ta₃N₅:Mg, Zr | None | 1 | None | 0 | PD599-Ti | 6 | 1.2 | 300 W Xe (λ ≥420 nm) |

*Photocurrent density is measurement value in measurement potential 1V (vs. RHE)

As is apparent from the results shown in Table 1, the electrodes obtained in Examples 1 to 6 had photocurrent density larger than that of the electrode obtained in Comparative Example 1. In particular, the electrodes obtained in Examples 1 to 6 have the photocurrent density of 1,000 µA/cm² or more, and the photocurrent density of 3 to 7 times the photocurrent density of the electrode obtained in Comparative Example 1 was obtained in the electrodes obtained in Examples 1 to 6.

In other words, it says that the form that a contact layer was provided between a photocatalyst layer and a current collecting layer by the production method of the present invention is a form excellent in photoelectric conversion efficiency as compared with the form that a conductive material is simply introduced in a photocatalyst layer by the conventional production method.

As is apparent from the comparison between Example 7 and Comparative Example 2, there was the difference of about 300 times in the photocurrent density between the case of introducing the contact layer by sputtering and the case of directly adhering a photocatalyst and a current collecting layer with a conductive adhesive. It was seen from this fact that it is preferred to form a contact layer using an appropriate conductor by a technique capable of forming close contact, such as a sputtering method or a vacuum deposition method.

(Observation of Form of Electrode)

Figure 9A:
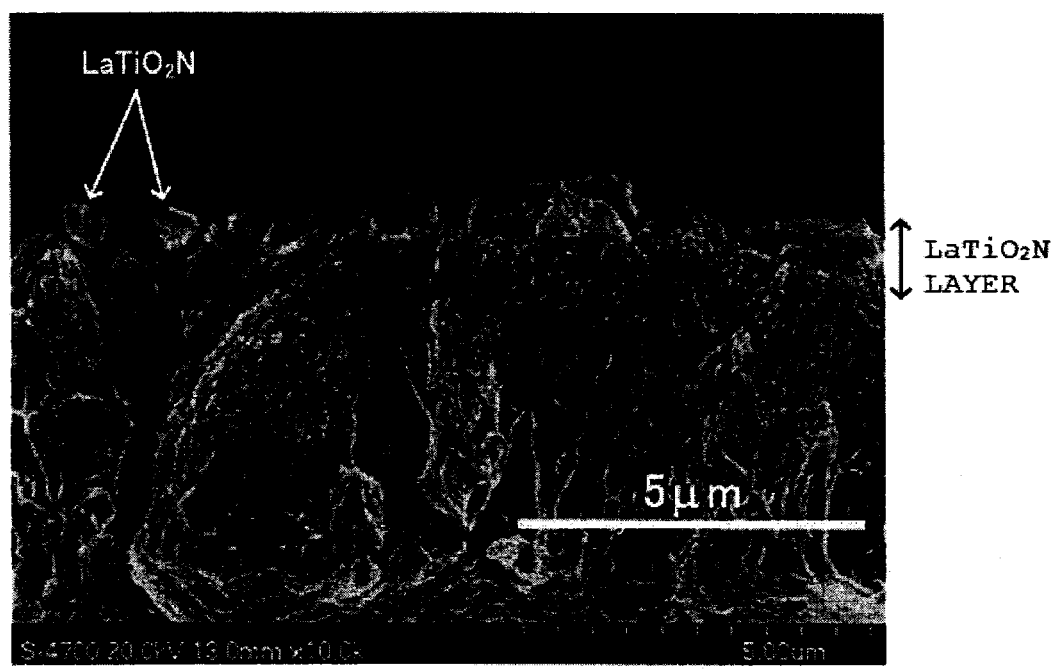
FIG. 9A and FIG. 9B are SEM images showing cross-sectional shapes of electrodes for water-splitting reaction according to Examples.
Figure 9B:
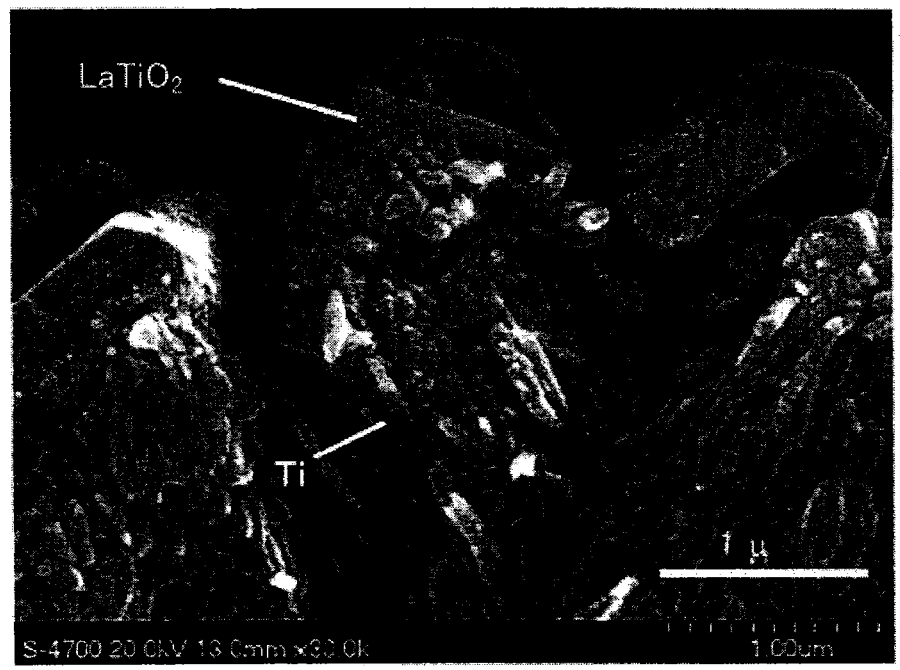
Figure 10:
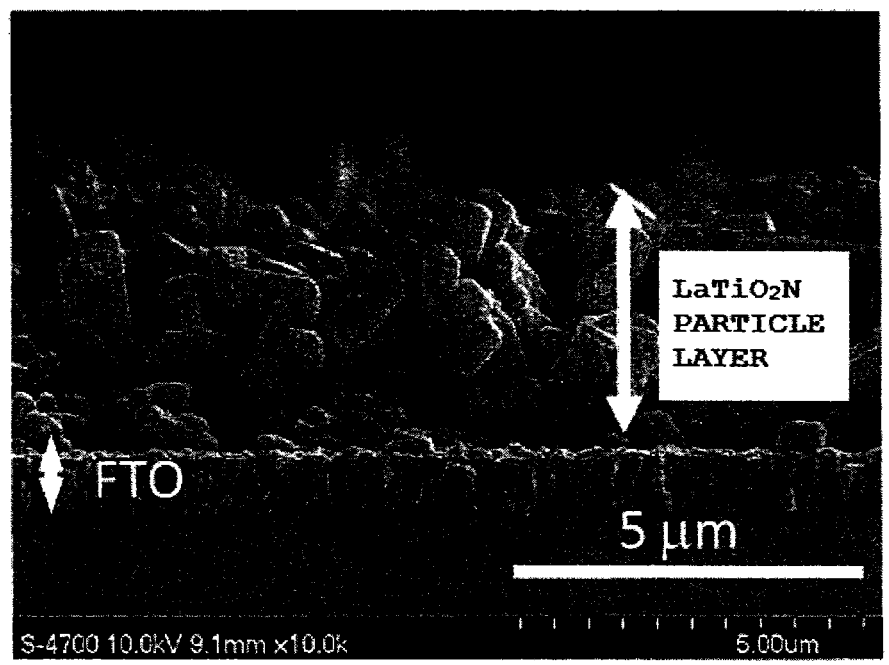
FIG. 10 is SEM image showing a cross-sectional shape of an electrode for water-splitting reaction according to Comparative Example.

Cross-sections of the electrodes obtained in Example 1 and Comparative Example 1 were observed with SEM. The results obtained are shown in FIGS. 9 and 10. FIG. 9A and FIG. 9B are the cross-section (accelerating voltage: 20 kV) of the electrode obtained in Example 1, and FIG. 10 is the cross-section (accelerating voltage: 10 kV) of the electrode obtained in Comparative Example 1.

As is apparent from FIG. 9A and FIG. 9B, the electrode obtained in Example 1 is that one or two layers, at a maximum three layers, of LaTiO₂N particles were stacked on a light receiving face side of the contact layer, and the average was one layer. Almost all of the LaTiO₂N particles came in contact with the contact layer.

On the other hand, as is apparent from FIG. 10, in the electrode obtained in Comparative Example 1, 5 or more layers of the LaTiO₂N particles were stacked on a light receiving face side of the current collecting layer, and the average stack number is eight. The photocatalyst at the light receiving face side did not come in contact with the current collecting layer.

Thus, in the electrodes obtained in the Examples, the stack number of the photocatalyst layer is small (the form that one or two layers, at a maximum three layers, of photocatalyst particles are stacked, and the average stack number is one), and light receivable photocatalyst particles come in contact with the contact layer. Therefore, it is considered that there becomes no influence of resistance between photocatalyst particles and photoelectric conversion efficiency was improved.

The cross-section of the electrode obtained in Example 1 was subjected to elemental mapping by SEM-EDS. The result obtained is shown in FIG. 11A to FIG. 11D. FIG. 11A is SEM image, FIG. 11B is the result of oxygen mapping corresponding to the photocatalyst layer, FIG. 11C is the result of Nb mapping corresponding to the contact layer, and FIG. 11D is the result of Ti mapping corresponding to the current collecting layer.

As is apparent from FIG. 11A to FIG. 11D, the electrode obtained in Example 1 is that the contact layer is formed along a shape at a current collecting layer side of the photocatalyst layer. By this constitution, the photocatalyst particles in the photocatalyst layer are directly contacted with the contact layer, and as a result, it is considered that conductive path between the photocatalyst layer and the current collecting layer was increased and photoelectric conversion efficiency was improved.

As is apparent from FIG. 11C, in the photocatalyst layer, Nb was eccentrically located at a contact layer side than a side (light receiving face side) opposite the contact layer, of the photocatalyst layer (that is, the amount of Nb present at a light receiving face side of the photocatalyst layer was relatively smaller than that at a contact layer side). This can inhibit absorption or reflection of light by Nb, and it is considered that light absorption by photocatalyst is not inhibited and photoelectric conversion efficiency was further improved.

TABLE 2

|  | Photosemiconductor material | Cocatalyst | Number of stack of photocatalyst layer | Contact layer | | Current collecting layer Material | pH | Photocurrent density* (µA/cm²) | Light source | Surface treatment |
|---|---|---|---|---|---|---|---|---|---|---|
|  |  |  |  | Material | Thickness (nm) |  |  |  |  |  |
| Example 8 | Ta₃N₅ | CoOx | 1 | Nb | 140 | Ti | 13 | 3000 | 300 W Xe (λ ≥420 nm) | None |

TABLE 2-continued

| | Photosemiconductor material | Cocatalyst | Number of stack of photocatalyst layer | Contact layer Material | Contact layer Thickness (nm) | Current collecting layer Material | pH | Photocurrent density* ($\mu A/cm^2$) | Light source | Surface treatment |
|---|---|---|---|---|---|---|---|---|---|---|
| Example 9 | $Ta_3N_5$ | CoOx | 1 | Nb | 140 | Ti | 13 | 5000 | 300 W Xe ($\lambda \geq 420$ nm) | $TiO_2$ |

As is apparent from Table 2, it was seen that by subjecting the surface treatment with $TiO_2$ to the electrode obtained, photocurrent density is further improved.

The present invention has been described above by reference to the embodiment that seems to be most practical and preferably at this time. However, the present invention is not limited to the embodiment disclosed in the present specification, and various modifications or changes can be made without departing the spirit and scope of the present readable from the claims and the entire description. It should be understood that the electrode for water-splitting reaction involving the modifications or changes and the production method of the same are included in the technical scope of the present invention.

While the invention has been described in detail and with reference to specific embodiments thereof, it will be apparent to one skilled in the art that various changes and modifications can be made therein without departing from the spirit and scope thereof. This application is based on Japanese patent application filed on Mar. 8, 2012 (Application No. 2012-052248), the contents thereof being incorporated herein by reference.

INDUSTRIAL APPLICABILITY

The present invention provides new possibility to production technique of an electrode for water-splitting reaction. Furthermore, by utilizing the electrode of the present invention, a system that efficiently promotes water splitting by applying potential to photocatalyst can be constructed. By using the electrode for water-splitting reaction according to the present invention, hydrogen production technology by effective water splitting can be provided.

DESCRIPTION OF REFERENCE NUMERALS

10 Photocatalyst layer
11 Photocatalyst particles
12 Cocatalyst
20 Contact layer
30 Current collecting layer
40 Adhesive layer
50a First Substrate
50b Second Substrate
61 Anode
62 Diaphragm
63 Cathode
64 Conductor
65 Water or electrolyte aqueous solution
100 Electrode for water-splitting reaction

The invention claimed is:

1. An electrode for water-splitting reaction comprising: a photocatalyst layer; a current collecting layer; and a contact layer that contains a first semiconductor or a first conductor and is provided between the photocatalyst layer and the current collecting layer,
wherein the photocatalyst layer consists essentially of photocatalyst particles, and
the contact layer is provided along the surface shape of the photocatalyst layer at the current collecting layer side of the photocatalyst layer, and
wherein the photocatalyst layer is directly exposed to light, and
wherein in the photocatalyst layer, a number of stack of photocatalyst particles in a lamination direction of the photocatalyst layer and the contact layer is from 1 to 3,
wherein the number of stack of photocatalyst particles in a lamination direction of the photocatalyst layer and the contact layer is the number of photocatalyst particles stacked vertically toward a light receiving face from the contact face.

2. The electrode for water-splitting reaction according to claim 1, wherein the photocatalyst layer further comprises a second semiconductor or a second conductor, and the second semiconductor or the second conductor in the photocatalyst layer is eccentrically located in the photocatalyst layer at the contact layer side, than the side opposite the contact layer.

3. The electrode for water-splitting reaction according to claim 1, wherein a photocurrent density at measurement potential of 1 V (vs. RHE) is 350 $\mu A/cm^2$ or more.

4. A method for producing hydrogen, comprising irradiating an electrode for water-splitting reaction dipped in water or an electrolyte aqueous solution with light to conduct a water photolysis, wherein the electrode for water-splitting reaction is the electrode for water-splitting reaction according to claim 1.

5. The electrode for water-splitting reaction according to claim 1, wherein the contact layer is in continuous contact with photocatalyst particles of the photocatalyst layer.

6. The electrode for water-splitting reaction according to claim 1, wherein the photocatalyst particles of the photocatalyst layer have an average particle size of from 50 nm to 100 μm.

7. The electrode for water-splitting reaction according to claim 1, wherein the photocatalyst particles of the photocatalyst layer are a mixture of primary particles and secondary particles, wherein the primary particles have an average particle size of from 50 nm to 100 μm, and the secondary particles have an average particle size of 500 nm to 100 μm.

8. A method for producing an electrode for water-splitting, reaction having a photocatalyst layer that is directly exposed to light, comprising:
a photocatalyst layer formation step of forming a photocatalyst layer that consists essentially of a mixture of photocatalyst particles and cocatalyst particles different from the photocatalyst particles, wherein in the mixture the cocatalyst particles are dispersed in the photocatalyst particles;

a contact layer formation step of covering one face of the photocatalyst layer with semiconductor or good conductor to form a contact layer; and a current collecting layer formation step of forming a current collecting layer on a face of the contact layer at the side opposite the photocatalyst layer of the contact layer.

9. The method for producing an electrode for water-splitting reaction according to claim 8, wherein in the contact layer formation step, the contact layer is formed on one face of the photocatalyst layer by sputtering the first semiconductor or the first conductor.

10. The method for producing an electrode for water-splitting reaction according to claim 8, wherein in the current collecting layer formation step, the current collecting layer is formed by sputtering.

11. The method for producing an electrode for water-splitting reaction according to claim 8, which further comprises a non-contact photocatalyst removal step of removing the photocatalyst particles that are not in contact with the contact layer.

12. The method for producing an electrode for water-splitting reaction according to claim 11, wherein in the photocatalyst layer formation step, the photocatalyst layer is formed by laminating photocatalyst on one face of a first substrate, and in the non-contact photocatalyst removal step, the first substrate is removed.

13. The method for producing an electrode for water-splitting reaction according to claim 8, which further comprises a reinforcing substrate formation step of forming a second substrate at the side opposite the contact layer of the current collecting layer after the current collecting layer formation step.

14. A method for producing hydrogen, comprising irradiating an electrode for water-splitting reaction dipped in water or an electrolyte aqueous solution, with light to conduct water photolysis, wherein the electrode for water-splitting reaction is the electrode for water-splitting reaction obtained by the production method according to claim 8.

* * * * *